(12) United States Patent
Hosokawa et al.

(10) Patent No.: US 8,112,057 B2
(45) Date of Patent: Feb. 7, 2012

(54) SAMPLING MIXER AND RECEIVER

(75) Inventors: Yoshifumi Hosokawa, Kanagawa (JP);
Akihiko Matsuoka, Kanagawa (JP);
Kentaro Miyano, Kanagawa (JP)

(73) Assignee: Panasonic Corporation, Osaka (JP)

( * ) Notice: Subject to any disclaimer, the term of this patent is extended or adjusted under 35 U.S.C. 154(b) by 818 days.

(21) Appl. No.: 12/094,495

(22) PCT Filed: Nov. 22, 2006

(86) PCT No.: PCT/JP2006/323341
§ 371 (c)(1),
(2), (4) Date: May 21, 2008

(87) PCT Pub. No.: WO2007/061000
PCT Pub. Date: May 31, 2007

(65) Prior Publication Data
US 2009/0270061 A1    Oct. 29, 2009

(30) Foreign Application Priority Data

Nov. 22, 2005  (JP) ................................. 2005-337345
Nov. 8, 2006   (JP) ................................. 2006-302798

(51) Int. Cl.
*H04B 1/26*    (2006.01)
*H03B 19/00*   (2006.01)

(52) U.S. Cl. ........ 455/313; 455/323; 455/333; 455/334; 327/113

(58) Field of Classification Search .................. 455/313, 455/318, 319, 323, 324, 333, 334; 327/113
See application file for complete search history.

(56) References Cited

U.S. PATENT DOCUMENTS

| 6,147,551 | A    |         | 11/2000 | Hong |
| 6,856,925 | B2 * | 2/2005  | Muhammad et al. ............ 702/75 |
| 7,006,813 | B2 * | 2/2006  | Staszewski et al. ........... 455/323 |
| 7,057,540 | B2 * | 6/2006  | Muhammad et al. ......... 341/143 |

(Continued)

FOREIGN PATENT DOCUMENTS

CN     1295736 A    5/2001

(Continued)

OTHER PUBLICATIONS

International Search Report Dated Feb. 27, 2007.
Chinese Office action dated Apr. 13, 2010.

*Primary Examiner* — Duc M Nguyen
(74) *Attorney, Agent, or Firm* — Pearne & Gordon LLP

(57) ABSTRACT

It is an object of the present invention to provide a sampling mixer and a receiver, capable of optimizing a sampling rate of an output signal in response to a fractional band of a modulation band with respect to an RF frequency of the received signal. A sampling mixer of the present invention, includes a history capacitor 6 for integrating a received signal that is converted in terms of current in a continuous time, rotation capacitors 7 to 14 for repeating an integration and a discharge of an input signal, a digital controller 104 for controlling integration periods of the rotation capacitors 7 to 14, and a controlling portion 105 for controlling discharges of the rotation capacitors 7 to 14, wherein the number of the rotation capacitors 7 to 14 connected at a time to a buffer capacitor 15 is switched in answer to a fractional band of the modulation band with respect to a RF frequency. As a result, the decimation ratio of the sampling rate can be varied, and the quantization noise generated in the AD conversion can be reduced.

5 Claims, 16 Drawing Sheets

U.S. PATENT DOCUMENTS

| | | | |
|---|---|---|---|
| 7,519,135 B2 * | 4/2009 | Staszewski et al. | 375/346 |
| 7,623,838 B2 * | 11/2009 | Staszewski et al. | 455/319 |
| 7,973,586 B2 * | 7/2011 | Hosokawa et al. | 327/355 |
| 2003/0040294 A1 | 2/2003 | Staszewski et al. | |
| 2003/0083033 A1 | 5/2003 | Staszewski et al. | |
| 2003/0083852 A1 * | 5/2003 | Muhammad et al. | 702/190 |

FOREIGN PATENT DOCUMENTS

| | | |
|---|---|---|
| JP | 09-036664 | 2/1997 |
| JP | 2002-198846 | 7/2002 |
| JP | 2004-289793 | 10/2004 |

* cited by examiner

PRIOR ART

SAMPLING MIXER AND RECEIVER

TECHNICAL FIELD

The present invention relates to a decimation-ratio variable sampling mixer and a receiver, which are used in a radio circuit of a radio communication equipment such as a mobile communication system, or the like to make a frequency conversion and a filtering by converting signals into discrete signals in time.

BACKGROUND ART

As the sampling mixer in the prior art, there is the mixer that samples the current-converted signal and produces a filter effect by a switched capacitor circuit, as set forth in Patent Literature 1. FIG. 8 is a circuit diagram of the sampling mixer set forth in Patent Literature 1 in the prior art.

In FIG. 8, a sampling mixer 800 includes a transconductance amplifier (TA) 1 for converting a received radio frequency (RF) signal into a current, an in-phase sampling mixer portion 2 for sampling the RF current signal output from the TA, an opposite-phase sampling mixer portion 3, and a digital control unit 4 for generating signals to control the in-phase sampling mixer portion 2 and the opposite-phase sampling mixer portion 3.

The in-phase sampling mixer portion 2 has a sampling switch 5 composed of FET, a history capacitor (Ch) 6 for integrating the signal sampled by the sampling switch 5 over a continuous time without a discharge, rotation capacitors (Cr) 7, 8, 9, 10, 11, 12, 13, 14 for repeating an integration and a discharge of the signal sampled by the sampling switch 5, a buffer capacitor (Cb) 15 for buffering the signals discharged from the rotation capacitors 7 to 14, a damping switch 16 for connecting/disconnecting the rotation capacitors 7 to 14 and the buffer capacitor 15, a reset switch 17 for resetting the rotation capacitors 7 to 14 after the signal is discharged, integrating switches 18, 19, 20, 21, 22, 23, 24, 25 for connecting/disconnecting the history capacitor 6 and the rotation capacitors 7 to 14, and discharging switches 26, 27, 28, 29, 30, 31, 32, 33 for connecting/disconnecting the rotation capacitors 7 to 14 and the buffer capacitor 15.

The damping switch 16, the reset switch 17, the integrating switches 18 to 25, and the discharging switches 26 to 33 are composed of the (n-type) FET respectively. The n-type FET is turned ON in its high state where a gate voltage is high, and is turned OFF in its low state where a gate voltage is low. The opposite-phase sampling mixer portion 3 has the same configuration as the in-phase sampling mixer portion 2.

The digital control unit 4 has a shift register 34 using eight registers, a local oscillator (not shown), and a frequency divider (not shown) for dividing a frequency of an output of the local oscillator. The frequency divider is connected to a terminal 35 connected to the discharging switches 26 to 29, and a terminal 36 connected to the discharging switches 30 to 33.

FIG. 9 is a timing chart of control signals that the digital control unit 4 generates. A CKV_LO signal is input into a gate of the sampling switch 5. CNT_SV0 to 7 signals are input into gates of the integrating switches 18 to 25 respectively. A CNT_SAZ signal is input into gates of the discharging switches 26, 27, 28, 29 from the terminal 35. A CNT_SBZ signal is input into gates of the discharging switches 30, 31, 32, 33 from the terminal 36. A CNT_D signal is input into a gate of the damping switch 16. A CNT_R signal is input into a gate of the reset switch 17.

An operation of the sampling mixer 800 will be explained by using the in-phase sampling mixer portion 2. The TA1 converts an RF signal into an RF current signal and outputs the current signal to the in-phase sampling mixer portion 2. In the in-phase sampling mixer portion 2, the sampling switch 5 samples the RF current signal by a local oscillation (LO) signal at the substantially same frequency as the RF current signal. The sampled RF current signal is given as a discrete signal that is discretized in terms of time.

When the discrete signal is integrated by the history capacitor 6 and the rotation capacitors 7 to 14, this signal is subjected to the filtering and the decimation. At first, the rotation capacitor 7 is connected to the history capacitor 6 by the CNT_SV0 signal, and the discrete signal is integrated in a period when the CNT_SV0 signal is high (during eight periods of the CKV_LO signal).

When the CNT_SV0 signal goes to low, the rotation capacitor 7 is disconnected from the history capacitor 6. The rotation capacitor 8 is connected to the history capacitor 6 by the CNT_SV1 signal. The rotation capacitor 8 integrates the discrete signal over eight periods of the CKV_LO signal, and then is disconnected from the history capacitor 6.

Similarly, the rotation capacitors 9 to 14 are connected in order to the history capacitor 6 by the CNT_SV2 to 7 signals every eight periods of the CKV_LO signal, and integrate the discrete signal respectively. The CNT_SV0 to 7 signals are output from the shift register 34.

A signal (LO/8 signal) whose frequency is 1/8 of the LO signal is input from the frequency divider to the terminal 37 as a clock signal of the shift register. Therefore, the shift register 34 shifts the signal to the next register every eight periods of the CKV_LO signal, and generates the CNT_SV0 to 7 signals sequentially.

At this time, the shift register 34 brings about an FIR (Finite Impulse Response) filter effect by integrating the discrete signal over eight periods of the CKV_LO signal. Thus, a sampling rate is decimated to 1/8 due to such an effect that a moving average of the discrete signals is calculated over eight periods of the CKV_LO signal. This filter effect is called a first-stage FIR filter.

Also, because the rotation capacitors 7 to 14 are connected sequentially to the history capacitor 6, the in-phase sampling mixer portion 2 brings about an IIR (Infinite Impulse Response) filter effect. This filter effect is called a first-stage IIR filter.

Then, the signals integrated by the rotation capacitors 7 to 14 are discharged to the buffer capacitor 15 in response to the CNT_SAZ signal. In this case, the signals integrated by the rotation capacitors 7 to 14 respectively are discharged to the buffer capacitor 15 at a time. The damping switch 16 is turned OFF by the CNT_D signal after the signals are discharged to the buffer capacitor 15. The reset switch 17 is turned ON by the CNT_R signal to reset the signals remaining in the rotation capacitors 7 to 10 during a period the damping switch 16 is turned OFF.

At this time, the in-phase sampling mixer portion 2 has the four-tap FIR filter effect because the signals integrated by the rotation capacitors 7 to 10 respectively are discharged to the buffer capacitor 15 at a time. Thus, a sampling rate is decimated to 1/4 due to such an effect that a moving average is applied to the signals integrated by the rotation capacitors 7 to 10 respectively.

Similarly, the rotation capacitors 11 to 14 discharge the signals integrated by these capacitors respectively to the buffer capacitor 15 at a time in response to the CNT_SBZ signal. Thus, a sampling rate is decimated to 1/4 due to a four-tap FIR filter effect. This filter effect is called a second-stage FIR filter. The CNT_SAZ signal and the CNT_SBZ signal are a signal (LO/64 signal) whose frequency is given by dividing a frequency of the LO signal by 64 in the digital control unit 4 respectively.

Also, because the groups of the rotation capacitors 7 to 10 and the rotation capacitors 11 to 14 are connected sequentially to the buffer capacitor 15, the in-phase sampling mixer portion 2 brings about another IIR filter effect. This filter effect is called a second-stage IIR filter.

The opposite-phase sampling mixer portion 3 carried out the similar operation. A difference from the in-phase sampling mixer portion 2 resides in that phases of the signals being input into the gates of the sampling switch 5 and a sampling switch 38 are different by 180 degree and a timing of the sampling is shifted by 180 degree in phase. A LOB signal whose phase is shifted from the LO signal by 180 degree is input into the sampling switch 38.

The frequency characteristic of the sampling mixer 800 when a frequency of the LO signal is set to 2.4 GHz is shown in FIG. 10. According to this, it was concluded that the sampling mixer 800 has the filter effect having a gain of 23 dB and a cut-off frequency of 1.0 MHz.

Patent Literature 1: U.S. Patent Application Publication No. 2003/0083033 Specification (pp. 7-8, FIG. 11a)

DISCLOSURE OF THE INVENTION

Problems that the Invention is to Solve

However, in the configuration in the prior art, a 1/8 decimation is done by the first-stage FIR filter and a 1/4 decimation is done by the second-stage FIR filter, and therefore a 1/32 decimation is done by the overall sampling mixer. Also, since a sampling rate is decided by the RF frequency, a sampling rate of an output signal of the sampling mixer is 1/32 of the RF frequency.

Therefore, when a modulation band is narrow in contrast to the frequency of the RF signal, a signal-to-noise ratio (SNR) can be sufficiently ensured after the signal whose sampling rate is decimated into 1/32 is analog-digital (AD) converted. However, when a modulation band is wide in contrast to the frequency of the RF signal, a quantization noise is increased when the sampling rate is decimated into 1/32, and therefore a signal-to-noise ratio (SNR) cannot be sufficiently ensured after the AD conversion.

Also, in the system (e.g., the digital television, or the like) using a wide-range RF frequency, the multi-band compatible system, and the like, a range of the sampling rate of the output signal of the sampling mixer becomes wide in answer to the received RF signal. In case the decimation is designed such that the enough SNR is obtained after the AD conversion when the RF signal of a low frequency is received, the AD conversion must be made still at a high sampling rate when the RF signal of a high frequency is received. As a result, the high-speed AD converter is needed, and therefore there existed such a situation that a current consumption is increased.

The present invention has been made in view of the above circumstances in the prior art, and it is an object of the present invention to provide a sampling mixer and a receiver, capable of optimizing a sampling rate of an output signal in response to a fractional band of a modulation band with respect to an RF frequency of the received signal.

Means for Solving the Problems

A sampling mixer of the present invention, includes a history capacitor which integrates a received signal that is converted into current in a continuous time; a plurality of rotation capacitors which are connected to the history capacitor for a predetermined time, and integrates the received signal; and a buffer capacitor which integrates signals discharged from the plurality of rotation capacitors; wherein, when signals that are integrated by the plurality of rotation capacitors are discharged to the buffer capacitor, a combination of the plurality of rotation capacitors that are connected at a time to the buffer capacitor is switched.

Accordingly, a decimation ratio of a sampling rate can be switched due to the effect of a moving average of the signals that are integrated in a plurality of rotation capacitors connected at a time to the buffer capacitor. The sampling rate of the output signal can be optimized in response to the fractional band of the modulation band with respect to the RF frequency, and also the quantization noise generated in the AD conversion can be reduced.

Also, the sampling mixer of the present invention further includes a plurality of integration switching sections which switch connections between the history capacitor and the plurality of rotation capacitors; a plurality of discharge switching sections which switch connections between the plurality of rotation capacitors and the buffer capacitor; and a shift register which switches the plurality of integration switching sections and the plurality of discharge switching sections.

Also, the sampling mixer of the present invention further includes a plurality of rotation capacitor switching sections which switch a combination of the plurality of rotation capacitors; a plurality of discharge signal switching sections which switch connections between the shift register and the plurality of discharge switching sections; and a controlling section which switch the plurality of rotation capacitor switching sections and the plurality of discharge signal switching sections.

Also, in the sampling mixer of the present invention, the plurality of rotation capacitors are eight rotation capacitors, and the rotation capacitors are connected at a time to the buffer capacitor every four capacitors, two capacitors, or one capacitor.

Accordingly, the sampling mixer of the present invention can switch the decimation ratio in three stages. Therefore, even when the signal whose modulation band is wide in contrast to the RF frequency is received, the sampling rate of the output signal can be optimized in response to the fractional band of the modulation band with respect to the RF frequency.

Also, in the sampling mixer of the present invention, when the rotation capacitors are connected at a time to the buffer capacitor every two capacitors, four groups in which the rotation capacitors are combined every two capacitors integrate the received signal sequentially, and when the rotation capacitors are connected to the buffer capacitor every capacitor, each of the rotation capacitors integrates the received signal sequentially.

Also, in the sampling mixer of the present invention, when the rotation capacitors are connected at a time to the buffer capacitor every two capacitors, two groups in which the rotation capacitors are combined every two capacitors integrate the received signal sequentially, and when the rotation capacitors are connected to the buffer capacitor every capacitor, two rotation capacitors integrates the received signal sequentially.

Accordingly, the number of the circuits to be operated is controlled smaller, and thus a current consumption can be suppressed.

Also, the sampling mixer of the present invention further includes a local oscillator which oscillates a reference signal corresponding to a frequency of the received signal; and a frequency divider which divides an output signal of the local oscillator, and switches the plurality of discharge switching sections.

Accordingly, there is no need to provide the frequency divider every time when the decimation ratio is switched, and the decimation ratio can be switched by one local oscillator. Therefore, a circuit scale can be reduced.

Also, in the sampling mixer of the present invention, the plurality of rotation capacitors are twelve rotation capacitors; and the rotation capacitors are connected at a time to the buffer capacitor every four capacitors, three capacitors, or two capacitors.

Also, in the sampling mixer of the present invention, the controlling section switches the plurality of rotation capacitor switching sections and the plurality of discharge signal switching sections, in response to a frequency of the received signal or a radio system that is holding communication.

Accordingly, the decimation ratio of the sampling rate can be changed in answer to the fractional band of the modulation band with respect to the RF frequency. Therefore, the high-speed AD converter is not needed, and also the current consumption can be suppressed.

Also, in the sampling mixer of the present invention, at least one of the plurality of rotation capacitors that are connected at a time to the buffer capacitor has a capacitance that is different from capacitances of remaining rotation capacitors.

Accordingly, the signals that are weighted by the rotation capacitance such that the notch is deepened and an amount of attenuation is increased can be integrated.

Also, the sampling mixer of the present invention further includes a plurality of integration switching sections which switch connections between the history capacitor and the plurality of rotation capacitors; a plurality of discharge switching sections which switch connections between the plurality of rotation capacitors and the buffer capacitor; and a shift register which switches the plurality of integration switching section and the plurality of discharge switching sections.

Also, the sampling mixer of the present invention further includes a plurality of rotation capacitor switching sections which switch a combination of the plurality of rotation capacitors; a plurality of discharging signal switching sections which switch connections between the shift register and the plurality of discharge switching sections; and a controlling section which switches the plurality of rotation capacitor switching sections and the plurality of discharging signal switching sections.

Also, in the sampling mixer of the present invention, the plurality of rotation capacitors are eight rotation capacitors, and the rotation capacitors are connected at a time to the buffer capacitor every five capacitors, three capacitors, or two capacitors.

Also, in the sampling mixer of the present invention, the rotation capacitors are twelve rotation capacitors, and the rotation capacitors are connected at a time to the buffer capacitor every five capacitors, four capacitors, or three capacitors.

Also, in the sampling mixer of the present invention, the controlling section switches the plurality of rotation capacitor switching sections and the plurality of discharge signal switching sections, in response to a frequency of the received signal or a radio system that is holding communication.

Also, a receiver of the present invention, includes an antenna which receives a radio signal; an amplifier which is connected to the antenna, and amplifies a received signal; a sampling mixer which is connected to the amplifier and generates a baseband signal that is obtained by applying a frequency conversion and a discretization in time to the received signal; and a signal processing portion which is connected to the sampling mixer, and processes the baseband signal.

Accordingly, the quantization noise generated in the AD conversion can be reduced in the received signal whose modulation band is wide in contrast to the RF frequency. Also, the decimation ratio of the sampling rate can be changed in answer to the fractional band of the modulation band with respect to the RF frequency. Therefore, the high-speed AD converter is not needed, and also the current consumption can be suppressed.

ADVANTAGES OF THE INVENTION

According to the present invention, the number of the rotation capacitors that discharge the signal at a time to the buffer capacitor respectively is changed, and thus the decimation ratio of the sampling rate can be switched. Therefore, the quantization noise caused during the AD conversion can be reduced in the received signal whose modulation band is wide in contrast to the RF frequency. Also, since the decimation ratio is changed in answer to the fractional band of the modulation band with respect to the RF frequency, the high-speed AD converter is not needed and also the current consumption can be suppressed.

Figure 1:
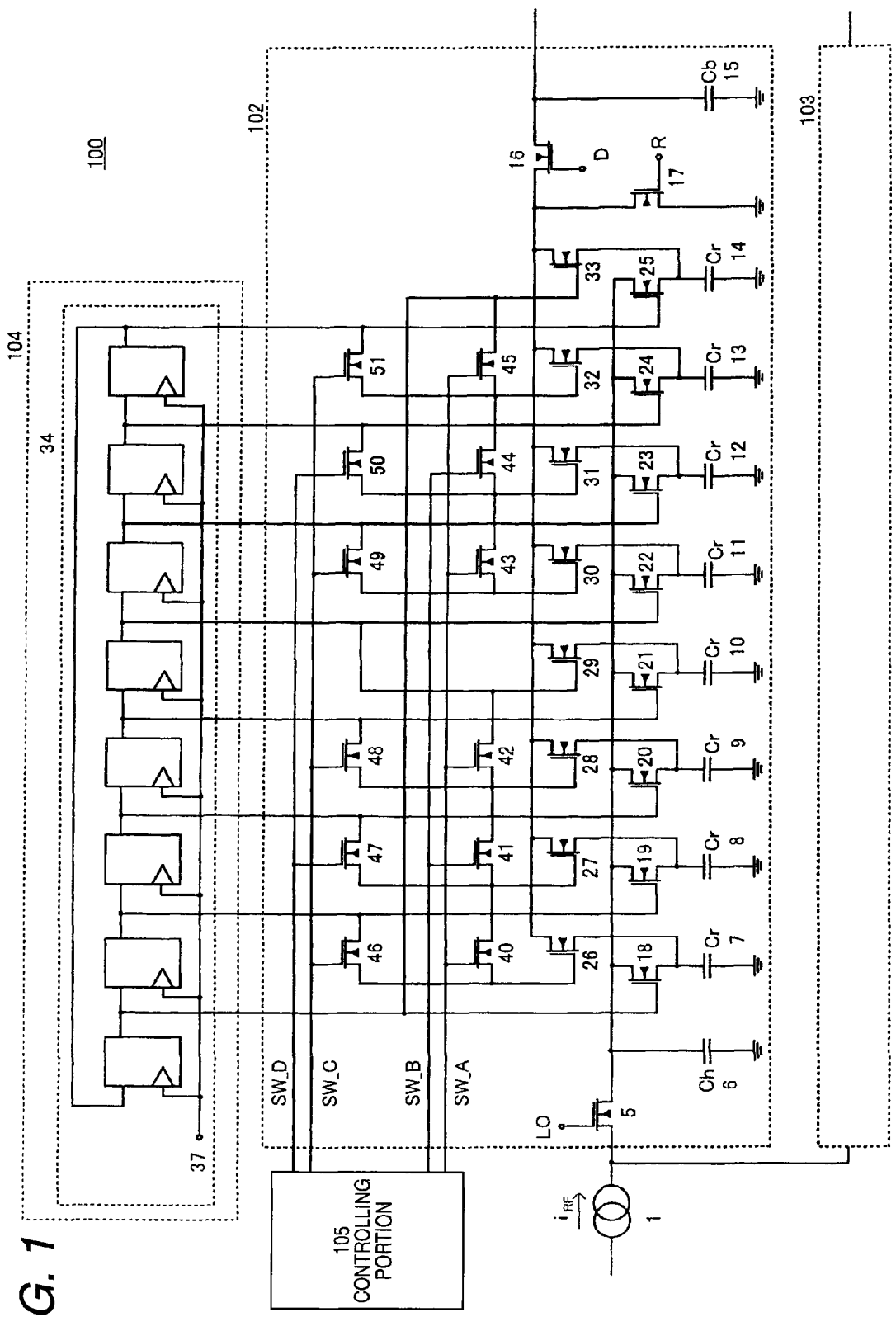
FIG. 1 A circuit diagram of a sampling mixer 100 in Embodiment 1 of the present invention.

DESCRIPTION OF REFERENCE NUMERALS 1 transconductance amplifier
2, 102, 202, 302, 402, 602, 702, 902 in-phase sampling mixer portion
3, 103, 203, 303, 403, 603, 703, 903 opposite-phase sampling mixer portion
4, 104, 304, 404, 604 digital control unit
5, 38 sampling switch
6 history capacitor
7, 8, 9, 10, 11, 12, 13, 14, 607, 608, 609, 610, 611, 612, 613, 614, 615, 616, 617, 618 rotation capacitor
15 buffer capacitor
16 damping switch
17 reset switch
18, 19, 20, 21, 22, 23, 24, 25, 619, 620, 621 623, 624, 625, 626, 627, 628, 629, 630 integrating switch
26, 27, 28, 29, 30, 31, 32, 33, 631, 632, 633, 634, 635, 636, 637, 638, 639, 640, 641, 642 discharging switch
34, 62 shift register
35, 36, 37 terminal
40, 41, 42, 43, 44, 45, 643, 644, 645, 646, 647, 648, 649, 720, 721, 722, 723, 724, 725, 726 rotation capacitor switching switch
46, 47, 48, 49, 50, 51, 52, 53, 54, 55, 56, 57, 58, 59, 650, 651, 652, 653, 654, 655, 656, 728, 729, 730, 731, 732, 733 discharge signal switch
60, 61 shift register changing switch
62 shift register
63, 64, 65, 66, 67, 68 register
70 local oscillator
71, 72, 73 local oscillator changing switch
74, 75, 76 frequency divider
100, 200, 300, 400, 503, 504, 600, 700, 900 sampling mixer
105, 205, 305, 605 controlling portion
500 radio equipment
501 antenna
502 low-noise amplifier
505 signal processing portion
707, 708, 709, 710, 711, 712, 713, 714 rotation capacitor portion
800 sampling mixer

BEST MODE FOR CARRYING OUT THE INVENTION

Embodiments of the present invention will be explained with reference to the drawings hereinafter. Also, the same reference symbols are affixed to the same constituent elements and are displayed throughout the drawings.

(Embodiment 1)

FIG. 1 is a circuit diagram of a sampling mixer in Embodiment 1 of the present invention. In FIG. 1, a sampling mixer 100 includes the TA (transconductance amplifier) 1, an in-phase sampling mixer portion 102, an opposite-phase sampling mixer portion 103, a digital control unit 104, and a controlling portion 105. In this case, the controlling portion 105 corresponds to a controlling section according to the present invention.

The in-phase sampling mixer portion 102 has the sampling switch 5 composed of the FET, the history capacitor (Ch) 6, the rotation capacitors (Cr) 7 to 14, the buffer capacitor (Cb) 15, the damping switch 16 composed of the FET, the reset switch 17 composed of the FET, the integrating switches 18 to 25, the discharging switches 26 to 33, rotation capacitor switching switches 40, 41, 42, 43, 44, 45, and discharge signal switches 46, 47, 48, 49, 50, 51. The integrating switches 18 to 25 correspond to an integration switching section according to the present invention, the discharging switches 26 to 33 correspond to a discharge switching section, the rotation capacitor switching switches 40 to 45 correspond to a rotation switching section, and the discharge signal switches 46 to 51 correspond to a discharge signal switching section.

The rotation capacitor switching switch 40 is connected between the discharging switch 26 and the discharging switch 27. The discharge signal switch 46 is connected between the gates of the discharging switch 26 and the integrating switch 19. Similarly, the rotation capacitor switching switches 41 to 45 are connected between the gates of the discharging switches 27 to 33 respectively, and the discharge signal switches 47 to 51 are connected between the gates of the discharging switches 27 to 33 and the integrating switches 20 to 25 respectively.

The gates of the rotation capacitor switching switches 40, 42, 43, 45 are connected to a control signal SW_A of the controlling portion 105. The gates of the rotation capacitor switching switches 41, 44 are connected to a control signal SW_B of the controlling portion 105. The gates of the discharge signal switches 46, 48, 49, 51 are connected to a control signal SW_C of the controlling portion 105. The gates of the discharge signal switches 47, 50 are connected to a control signal SW_D of the controlling portion 105.

The opposite-phase sampling mixer portion 103 has the same configuration as the in-phase sampling mixer portion 102. The signals being input into the gates of the sampling switches have a phase difference of 180 degree mutually, and the sampling timings are shifted mutually by 180 degree.

Figure 2:
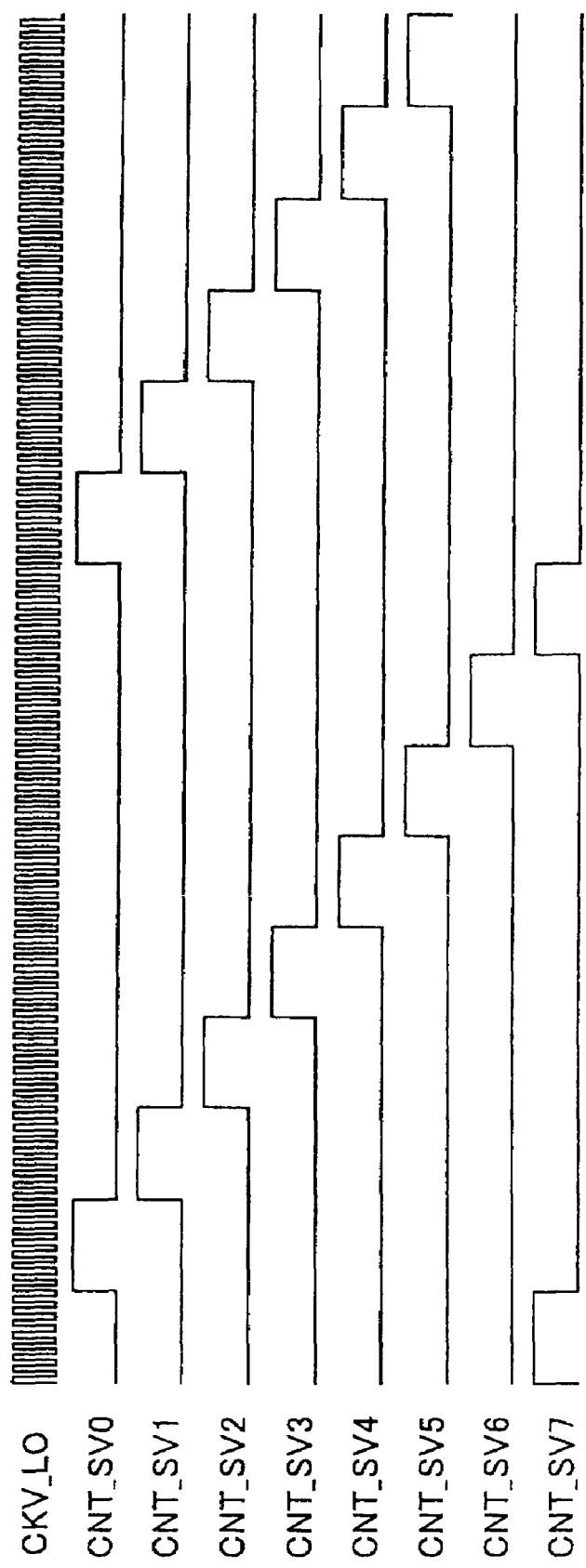
FIG. 2 A timing chart of signals that a digital control unit 104 in Embodiment 1 of the present invention generates.

FIG. 2 is a timing chart of the control signals that the digital control unit 104 generates. The CKV_LO signal is input into the gate of the sampling switch 5. The CNT_SV0 to 7 signals are input into the gates of the integrating switches 18 to 25 respectively.

An operation of the sampling mixer 100 will be explained by using the in-phase sampling mixer portion 102. The in-phase sampling mixer portion 102 constitutes the first-stage FIR filter because the discrete signal is integrated over eight periods of the CKV_LO signal by the history capacitor (Ch) 6 and the rotation capacitors (Cr) 7 to 14. At this time, a sampling rate is decimated into 1/8 due to the effect of a moving average. Also, the in-phase sampling mixer portion 102 constitutes the first-stage IIR filter because the rotation capacitors 7 to 14 connected to the history capacitor 6 are switched sequentially.

Then, the signals integrated by the rotation capacitors 7 to 10 are discharged to the buffer capacitor 15. At this time, when the number of the rotation capacitors that discharge the signal to the buffer capacitor 15 at a time is switched to four, two, one selectively, the decimation ratio due to the effect of a moving average of the second FIR filter can be switched in three stages, i.e., 1/4, 1/2, 1 (no decimation).

When the signals are discharged at a time from four rotation capacitors to the buffer capacitor 15, the control signal SW_A and the control signal SW_B are high, and the control signal SW_C and the control signal SW_D are low. As a result, the gates of the discharging switches 26 to 29 connected to the rotation capacitors 7 to 10 are connected, and thus the integrated signals are discharged to the buffer capacitor 15 by the CNT_SV4 signal.

Similarly, the gates of the discharging switches 30 to 33 connected to the rotation capacitors 11 to 14 are connected, and thus the integrated signals are output to the buffer capacitor 15 by the CNT_SV0 signal. Since the signals are discharged at a time from four rotation capacitors, the second-stage FIR filter contains four taps and a sampling rate is decimated to 1/4.

When the signals are discharged at a time from two rotation capacitors to the buffer capacitor 15, the control signal SW_A and the control signal SW_D are high, and the control signal SW_B and the control signal SW_C are low. As a result, the gates of the discharging switches 26, 27 connected to the rotation capacitors 7, 8 are connected, and thus the integrated signals are discharged to the buffer capacitor 15 by the CNT_SV2 signal.

Similarly, the gates of the discharging switches 28, 29, the gates of the discharging switches 30, 31, and the gates of the discharging switches 32, 33 are connected, and thus the signals are discharged to the buffer capacitor 15 by the CNT_SV4 signal, the CNT_SV6 signal, and the CNT_SV0 signal respectively. Since the signals are discharged at a time from two rotation capacitors, the second-stage FIR filter contains two taps and a sampling rate is decimated to 1/2.

When the signal is discharged from one rotation capacitor to the buffer capacitor 15, the control signal SW_C and the control signal SW_D are high, and the control signal SW_A and the control signal SW_B are low. As a result, the rotation capacitors 7 to 14 are connected to the buffer capacitor 15 sequentially, and the signal integrated in one rotation capacitor is discharged to the buffer capacitor 15. At this time, the effect of the second-stage FIR filter is not brought about, and a sampling rate is neither changed nor decimated.

Also, when the rotation capacitors are connected to the buffer capacitor 15 sequentially every four pieces, two pieces, and one piece, the second-stage IIR filter is constructed respectively.

Figure 3:
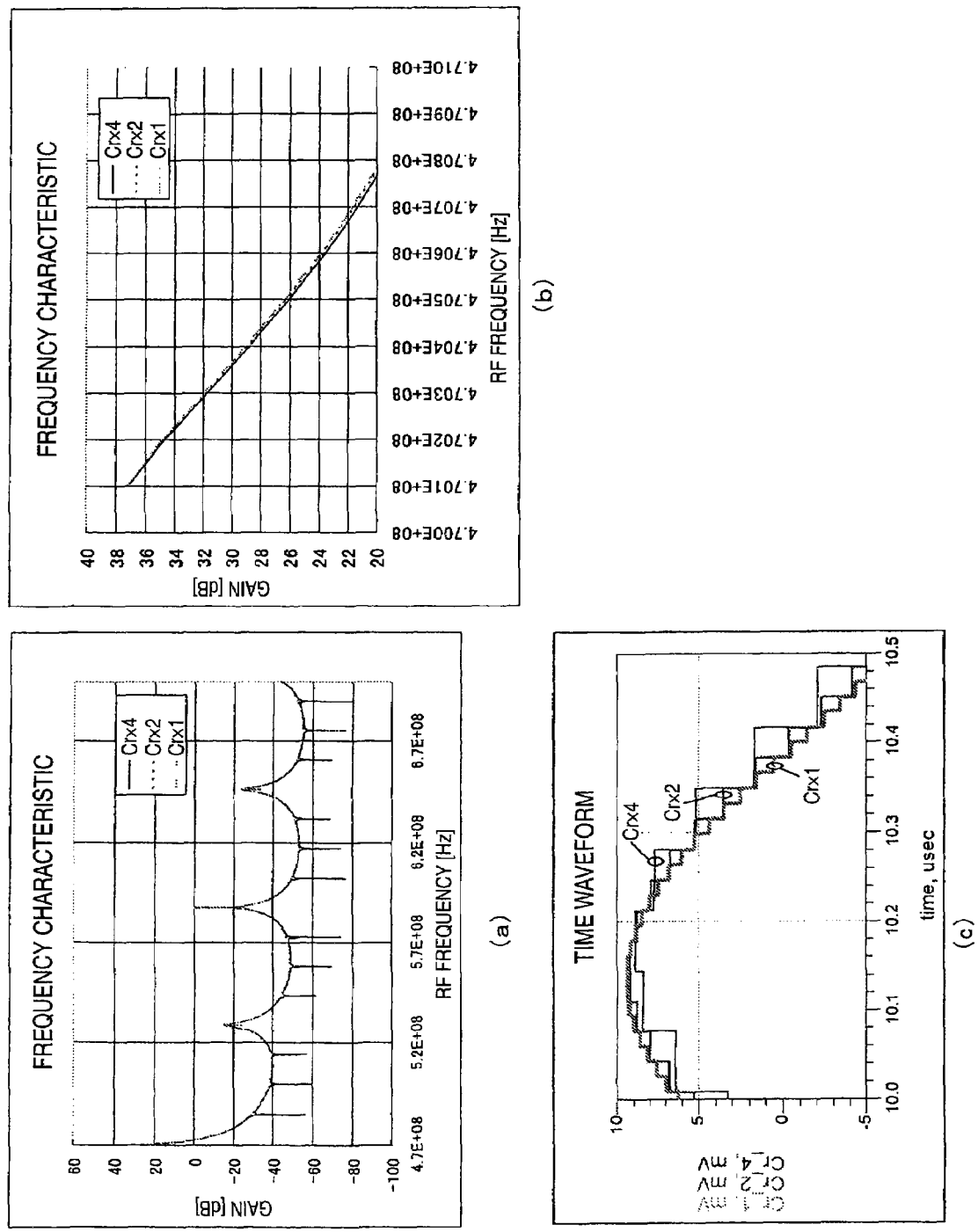
FIG. 3 Views showing frequency characteristics of the sampling mixer 100 in Embodiment 1 of the present invention.

FIGS. 3(*a*),(b),(c) show the frequency characteristics of the sampling mixer 100. At this time, the frequency of the LO signal is 470 MHz. FIG. 3(*a*) shows the frequency characteristic. When the number of the rotation capacitors that discharge the signals at a time to the buffer capacitor 15 is changed, the number of notches is changed, but the frequency characteristic is not changed. FIG. 3(*b*) shows the frequency characteristic in which the cut-off frequency and its neighborhood in FIG. 3(*a*) is enlarged. Accordingly, the cut-off frequency is not changed even when the number of the rotation capacitors is changed.

FIG. 3(*c*) shows a time waveform. As shown in FIG. 3(*c*), a waveform by which the signals are discharged at a time from four rotation capacitors has a low sampling rate because its sampling interval is wide, while a waveform by which the signals are discharged at a time from two rotation capacitors or one rotation capacitor has a high sampling rate because its sampling interval is narrow.

The controlling portion 105 controls the control signal SW_A, the control signal SW_B, the control signal SW_C, and the control signal SW_D in response to information such as the frequency of the received signal, the radio system that is holding the communication, and the like. The controlling portion 105 stores in advance the decimation ratio, at which the sampling rate of the output signal is optimized, every frequency or channel of the received signal. That is, the controlling portion 105 stores combinations of the rotation capacitors that are connected simultaneously to the buffer capacitor 15.

When the user designates the frequency or the channel by the operation, the controlling portion 105 outputs the control signal to meet the designated frequency or channel. Otherwise, when a signal processing portion connected to the later stage of the sampling mixer 10 feeds frequency or channel information used in the communication via a broadcast channel (e.g., BCCH in GSM, or the like) of the radio system, a service set identifier, or the like, the controlling portion 105 outputs the control signal.

As the signal being input into the gates of the discharging switches 26 to 33, the signal being input from the digital control unit 104 to the integrating switches 18 to 25 is also used. Therefore, the digital control unit 104 has only the frequency divider that generates the LO/8 signal being input into a terminal 37.

With the above, according to the sampling mixer of the present embodiment, the number of rotation capacitors that discharge the signal to the buffer capacitor simultaneously is changed, and thus the decimation ratio of the sampling rate can be switched.

As a result, the quantization noise generated in the AD conversion can be reduced in the received signal whose modulation band is wide in contrast to the RF frequency. Also, since the decimation ratio is changed in response to the fractional band of the modulation band with respect to the RF frequency, the AD converter that operates at a high speed is not needed and a current consumption can be suppressed.

Also, in the present embodiment, the n-type FET is used as the element constituting the switch. But a p-type FET may be used or the n-type FET and the p-type FET may be used in combination. Also, the micro electro mechanical systems (MEMS) may be employed as the switch.

Also, in the present embodiment, the number of the rotation capacitors is set to eight, but such number is not limited to this numerical value. Also, in the present embodiment, the number of the rotation capacitors that discharge the signal to the buffer capacitor at the same time is switched to four, two, and one, but such number is not limited to this numerical value.

(Embodiment 2)

Figure 4:
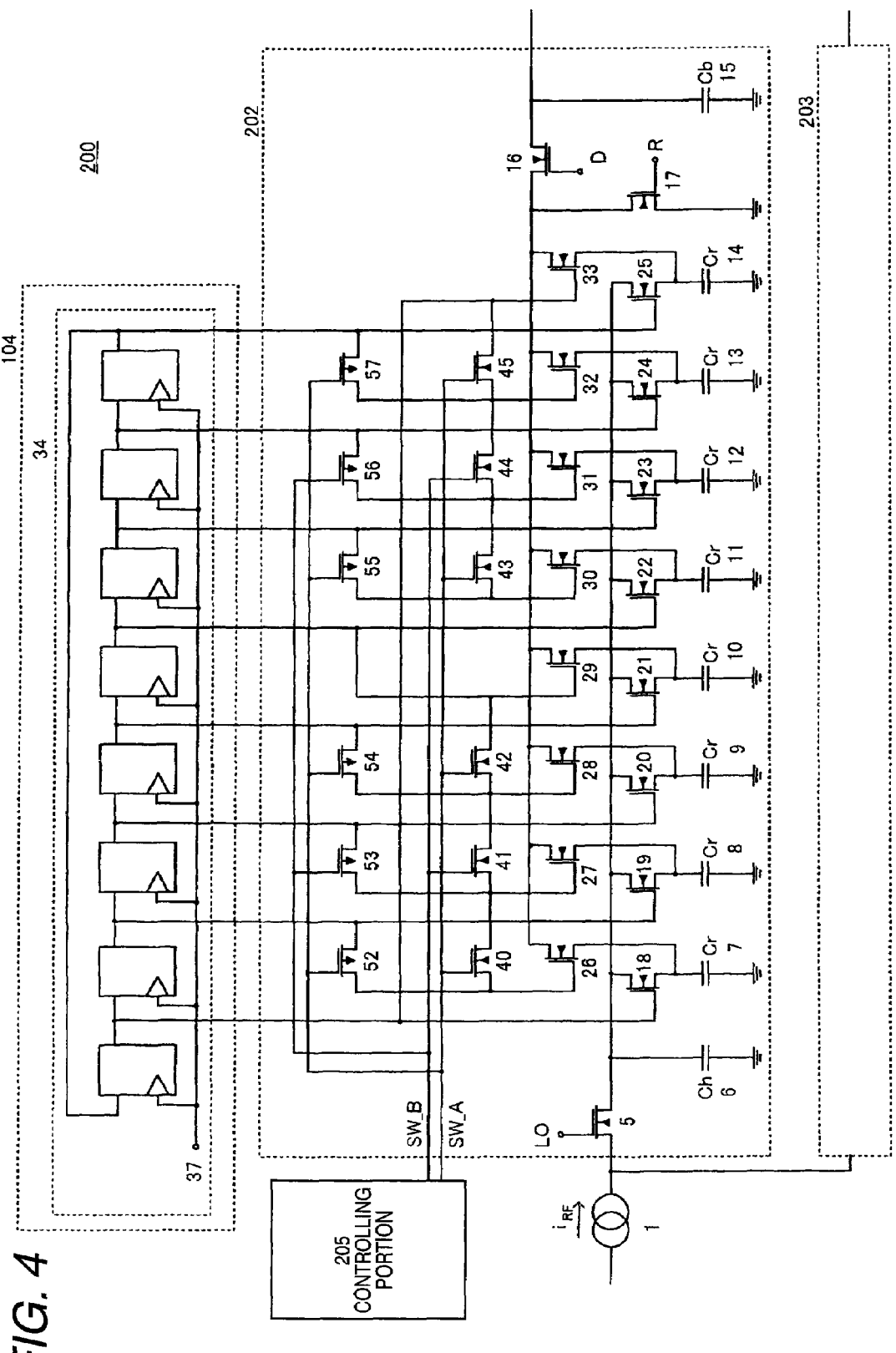
FIG. 4 A circuit diagram of a sampling mixer 200 in Embodiment 2 of the present invention.

FIG. 4 is a circuit diagram of a sampling mixer 200 in Embodiment 2 of the present invention. Only differences from Embodiment 1 will be explained hereunder.

The present embodiment provides a sampling mixer in which the n-type FET discharge signal switches 46 to 51 (FIG. 1) in Embodiment 1 are replaced with p-type FET discharge signal switches and also the rotation capacitor switching switches and the discharge signal switches are controlled by the same signal.

In FIG. 4, an in-phase sampling mixer portion 202 has p-type FET discharge signal switches 52 to 57 in place of the n-type FET discharge signal switches 46 to 51. The discharge signal switch 52 is connected between the gates of the discharging switch 26 and the integrating switch 19. Similarly, the discharge signal switches 53 to 57 are connected between the gates of the discharging switches 27 to 33 and the integrating switches 20 to 25 respectively.

The gates of the discharge signal switches 52, 54, 55, 57 are connected to the control signal SW_A of a controlling portion 205. The gates of the discharge signal switches 53, 56 are connected to the control signal SW_B of the controlling portion 205. The p-type FET is turned OFF when its gate voltage is in a high state and is turned ON when its gate voltage is in a low state.

An opposite-phase sampling mixer portion 203 has the same configuration as the in-phase sampling mixer portion 202. The signals being input into the gates of the sampling switches have a phase difference of 180 degree, and the sampling timing is shifted in phase by 180 degree.

An operation of the second-stage FIR filter will be explained hereunder. When the signals are discharged at a time from four rotation capacitors to the buffer capacitor 15, the control signal SW_A and the control signal SW_B are high. As a result, the second-stage FIR filter contains four taps and a sampling rate is decimated to 1/4.

When the signals are discharged at a time from two rotation capacitors to the buffer capacitor 15, the control signal SW_A is high, and the control signal SW_B is low. As a result, the second-stage FIR filter contains two taps and a sampling rate is decimated to 1/2.

When the signal is discharged from one rotation capacitor to the buffer capacitor 15, the control signal SW_A and the control signal SW_B are low. At this time, the effect of the second-stage FIR filter is not brought about, and a sampling rate is neither changed nor decimated.

The controlling portion 205 controls the control signal SW_A and the control signal SW_B in response to information such as the frequency of the received signal, the radio system that is holding the communication, and the like. With the above, according to the sampling mixer of the present embodiment, the control made by the controlling portion can be simplified in addition to the advantages of Embodiment 1.

(Embodiment 3)

Figure 5:
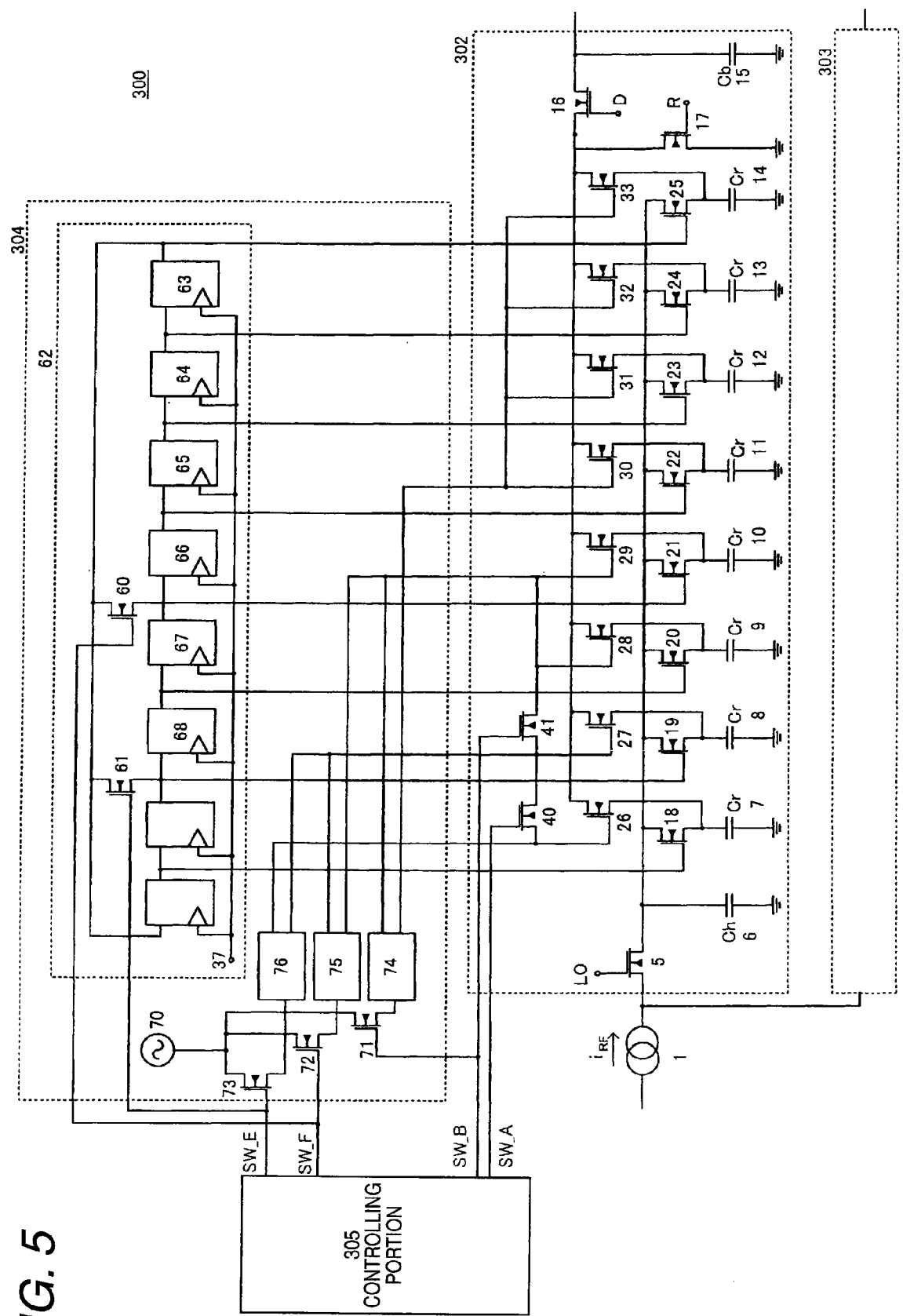
FIG. 5 A circuit diagram of a sampling mixer 300 in Embodiment 3 of the present invention.

FIG. 5 is a circuit diagram of a sampling mixer 300 in Embodiment 3 of the present invention. Only differences from Embodiment 1 will be explained hereunder.

The present embodiment provides the sampling mixer in which the discharge signal switches 46 to 51 and the rotation capacitor switching switches 42 to 45 in Embodiment 1 are omitted, and shift register changing switches 60, 61, a local oscillator 70, local oscillator changing switches 71, 72, 73, and frequency dividers 74, 75, 76 are provided to a digital control unit 304.

In FIG. 5, the shift register changing switch 60 is connected between the gates of the integrating switch 21 and the integrating switch 25. Also, the shift register changing switch 61 is connected between the gates of the integrating switch 24 and the integrating switch 24.

The gate of the shift register changing switch 60 is connected to a control signal SW_F of a controlling portion 305. The gate of the shift register changing switch 61 is connected to a control signal SW_E of the controlling portion 305.

The local oscillator changing switch 71 is connected to the local oscillator 70 and the frequency divider 74, and its gate is connected to the control signal SW_B of the controlling portion 305. The local oscillator changing switch 72 is connected to the local oscillator 70 and the frequency divider 75, and its gate is connected to the control signal SW_F of the controlling portion 305. The local oscillator changing switch 73 is connected to the local oscillator 70 and the frequency divider 76, and its gate is connected to the control signal SW_E of the controlling portion 305.

An opposite-phase sampling mixer portion 303 has the same configuration as the in-phase sampling mixer portion 302. The signals being input into the gates of the sampling switches have a phase difference of 180 degree, and the sampling timing is shifted in phase by 180 degree.

An operation of the second-stage FIR filter will be explained hereunder. When the signals are discharged at a time from four rotation capacitors to the buffer capacitor 15, the control signal SW_A and the control signal SW_B are high, and the control signal SW_E and the control signal SW_F are low.

The local oscillator 70 is connected to the frequency divider 74 via the local oscillator changing switch 71. The frequency divider 74 outputs the LO/64 signal, which is obtained by dividing the frequency of the LO signal by 64, to the gates of the discharging switches 26 to 29 and the gates of the discharging switches 30 to 33 in a differential manner. As a result, the second-stage FIR filter contains four taps and a sampling rate is decimated to 1/4.

When the signals are discharged at a time from two rotation capacitors to the buffer capacitor 15, the control signal SW_A and the control signal SW_F are high, and the control signal SW_B and the control signal SW_E are low.

The local oscillator 70 is connected to the frequency divider 75 via the local oscillator changing switch 72. The frequency divider 75 outputs the LO/32 signal, which is obtained by dividing the frequency of the LO signal by 32, to the gates of the discharging switches 26, 27 and the gates of the discharging switches 28, 29 in a differential manner. As a result, the second-stage FIR filter contains two taps and a sampling rate is decimated to 1/2.

Also, since the rotation capacitors 11 to 14 are not used, there is no need to operate registers 63 to 66 that are connected to the integrating switches 22 to 24. Therefore, a current consumption in the registers 63 to 66 can be reduced in a shift register 62.

When the signal is discharged from one rotation capacitor to the buffer capacitor 15, the control signal SW_E is high, and the control signal SW_A, the control signal SW_B, and the control signal SW_F are low. The local oscillator 70 is connected to the frequency divider 76 via the local oscillator changing switch 73.

The frequency divider 76 outputs the LO/16 signal, which is obtained by dividing the frequency of the LO signal by 16, to the gate of the discharging switch 26 and the gate of the discharging switch 27 in a differential manner. As a result, the effect of the second-stage FIR filter is not brought about, and a sampling rate is neither changed nor decimated.

Also, since the rotation capacitors 8 to 14 are not used, there is no need to operate the registers 63 to 68 that are connected to the integrating switches 22 to 24. Therefore, a current consumption in the registers 63 to 68 can be reduced in a shift register 62.

The controlling portion 305 controls the control signal SW_A, the control signal SW_B, the control signal SW_E, and the control signal SW_F in response to information such as the frequency of the received signal, the radio system that is holding the communication, and the like. With the above, according to the sampling mixer of the present embodiment, the current consumption can be reduced in addition to the advantages of Embodiment 1.

(Embodiment 4)

Figure 6:
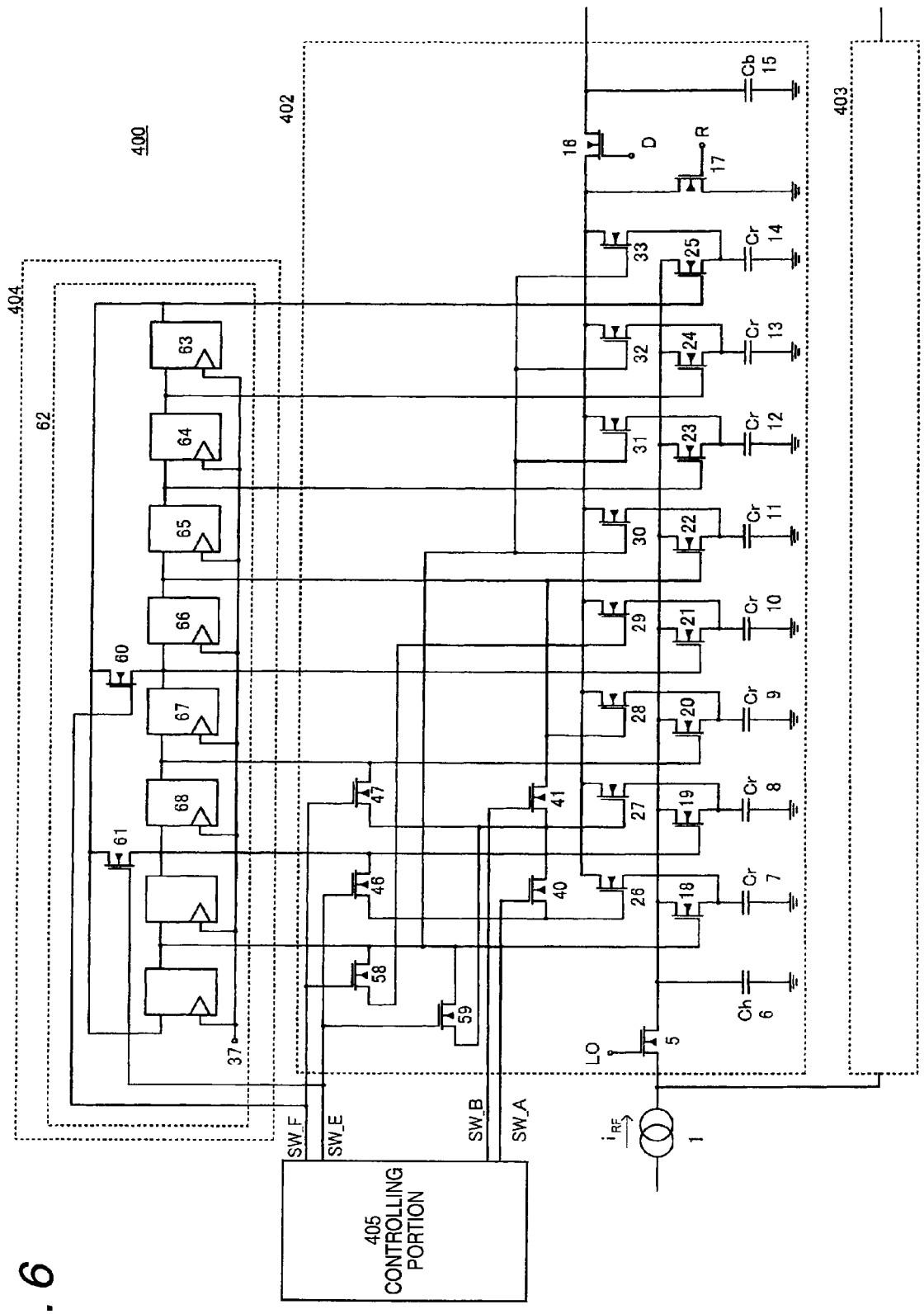
FIG. 6 A circuit diagram of a sampling mixer 400 in Embodiment 4 of the present invention.

FIG. 6 is a circuit diagram of a sampling mixer 400 in Embodiment 4 of the present invention. Only differences from Embodiment 3 will be explained hereunder.

The present embodiment provides the sampling mixer in which the local oscillator changing switches 71, 72, 73 and the frequency dividers 74, 75, 76 in Embodiment 3 are omitted and the discharge signal switches 46, 47, 58, 59 are provided.

In FIG. 6, the discharge signal switch 58 is connected between the gates of the discharging switch 29 and the integrating switch 18. The discharge signal switch 59 is connected between the gates of the discharging switch 27 and the integrating switch 18.

The shift register changing switch 60 is connected between the gates of the integrating switch 21 and the integrating switch 25. The shift register changing switch 61 is connected between the gates of the integrating switch 19 and the integrating switch 25.

The gates of the discharge signal switches 46, 59 and the shift register changing switch 61 are connected to the control signal SW_E of a controlling portion 405. The gates of the discharge signal switches 47, 58 and the shift register changing switch 60 are connected to the control signal SW_F of the controlling portion 405.

An opposite-phase sampling mixer portion 403 has the same configuration as an in-phase sampling mixer portion 402. The signals being input into the gates of the sampling switches have a phase difference of 180 degree, and the sampling timing is shifted in phase by 180 degree.

An operation of the second-stage FIR filter will be explained hereunder. When the signals are discharged at a time from four rotation capacitors to the buffer capacitor 15, the control signal SW_A and the control signal SW_B are high, and the control signal SW_E and the control signal SW_F are low. As a result, the second-stage FIR filter contains four taps and a sampling rate is decimated to 1/4.

When the signals are discharged at a time from two rotation capacitors to the buffer capacitor 15, the control signal SW_A and the control signal SW_F are high, and the control signal SW_B and the control signal SW_E are low. As a result, the second-stage FIR filter contains two taps and a sampling rate is decimated to 1/2.

Also, since the rotation capacitors 11 to 14 are not used, there is no need to operate the registers 63 to 66 that are connected to the integrating switches 22 to 24. Therefore, a current consumption in the registers 63 to 66 can be reduced in the shift register 62.

When the signal is discharged from one rotation capacitor to the buffer capacitor 15, the control signal SW_E is high, and the control signal SW_A, the control signal SW_B, and the control signal SW_F are low. As a result, the effect of the second-stage FIR filter is not brought about, and a sampling rate is neither changed nor decimated.

Also, since the rotation capacitors 8 to 14 are not used, there is no need to operate the registers 63 to 68 that are connected to the integrating switches 20 to 24. Therefore, a current consumption in the registers 63 to 68 can be reduced in the shift register 62.

The controlling portion 405 controls the control signal SW_A, the control signal SW_B, the control signal SW_E, and the control signal SW_F in response to information such as the frequency of the received signal, the radio system that is holding the communication, and the like. With the above, according to the sampling mixer of the present embodiment, the frequency divider is not needed and thus a circuit scale can be reduced in addition to the advantages of Embodiment 3.

(Embodiment 5)

Figure 11:
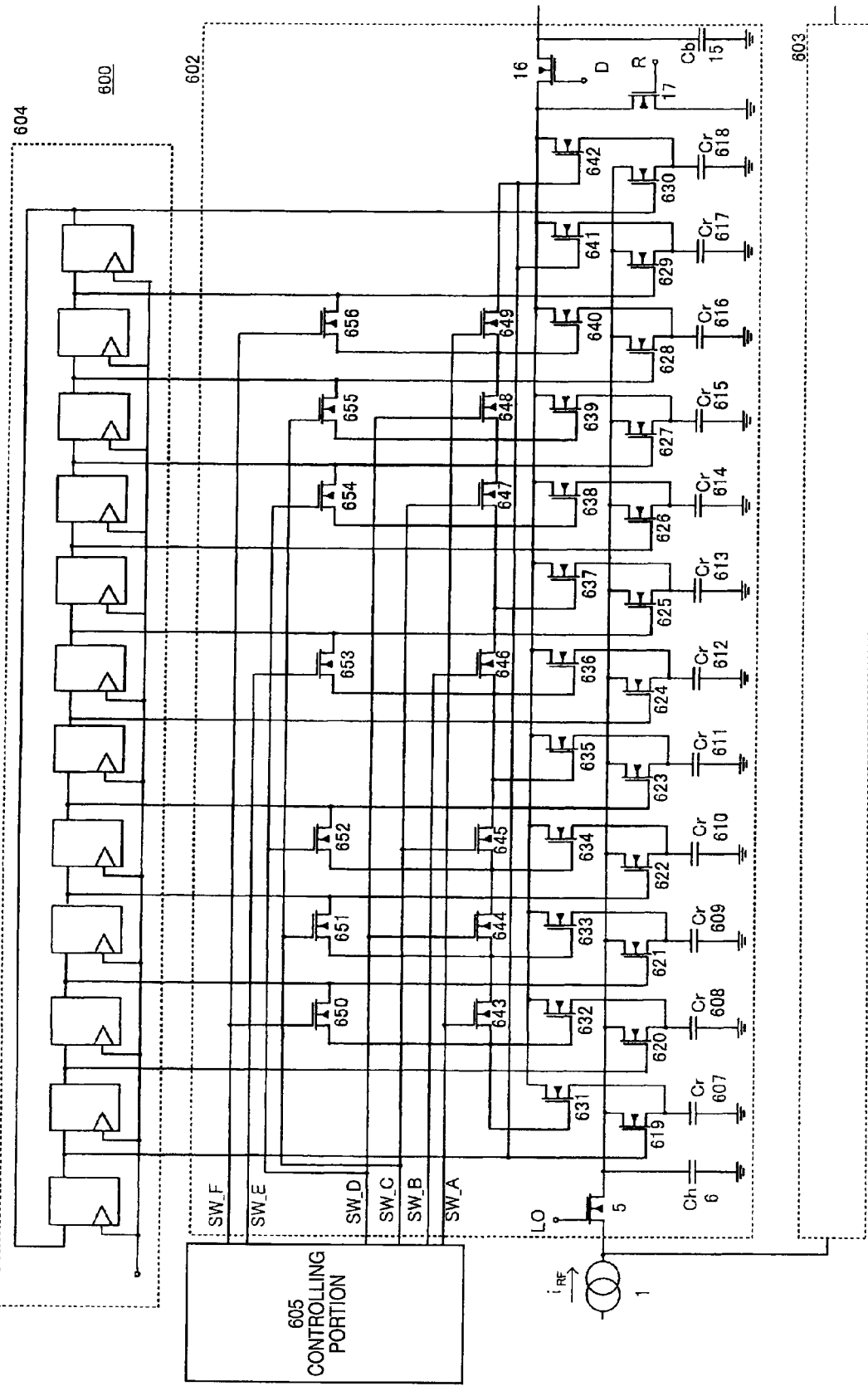
FIG. 11 A circuit diagram of a sampling mixer 600 in Embodiment 5 of the present invention.

FIG. 11 is a circuit diagram of a sampling mixer 600 in Embodiment 5 of the present invention. Only differences from Embodiment 1 will be explained hereunder. The present embodiment provides the sampling mixer in which the number of rotation capacitors, which is set to eight in Embodiment 1, is set to twelve. The sampling mixer 600 includes an in-phase sampling mixer portion 602, an opposite-phase sampling mixer portion 603, a digital control unit 604, and a controlling portion 605.

The in-phase sampling mixer portion 602 has rotation capacitors (Cr) 607 to 618, integrating switches 619 to 630, discharging switches 631 to 642, rotation capacitor switching switches 643 to 649, and discharge signal switches 650 to 656.

The rotation capacitor switching switch 643 is connected between the gates of the discharging switch 632 and the discharging switch 633. Similarly, the rotation capacitor switching switches 644 to 649 are connected between the gates of the discharging switches 633 to 641 respectively. The gates of the discharging switch 631 and the discharging switch 632 are connected. Similarly, the gates of the discharging switch 635 and the discharging switch 636 are connected, and the gates of the discharging switch 641 and the discharging switch 642. The discharge signal switch 650 is connected between the gates of the discharging switch 632 and the integrating switch 621. Similarly, the discharge signal switches 651 to 656 are connected between the gates of the discharging switches 633, 634, 636, 638 to 640 and the integrating switches 622, 623, 625, 627 to 629 respectively.

The gates of the rotation capacitor switching switches 643, 649 are connected to the control signal SW_A of the controlling portion 605. The gate of the rotation capacitor switching switch 646 is connected to the control signal SW_B of the controlling portion 605. The gates of the rotation capacitor switching switches 645, 647 are connected to the control signal SW_C of the controlling portion 605. The gates of the rotation capacitor switching switches 644, 648 are connected to the control signal SW_D of the controlling portion 605. The gates of the discharge signal switches 651, 655 are connected to the control signal SW_C of the controlling portion 605. The gates of the discharge signal switches 652, 654 are connected to the control signal SW_D of the controlling portion 605. The gate of the discharge signal switch 653 is connected to the control signal SW_E of the controlling portion 605. The gates of the discharge signal switches 650, 656 are connected to the control signal SW_F of the controlling portion 605.

The opposite-phase sampling mixer portion 603 has the same configuration as the in-phase sampling mixer portion 602. The signals being input into the gates of the sampling switches have a phase difference of 180 degree, and the sampling timing is shifted in phase by 180 degree.

Figure 12:
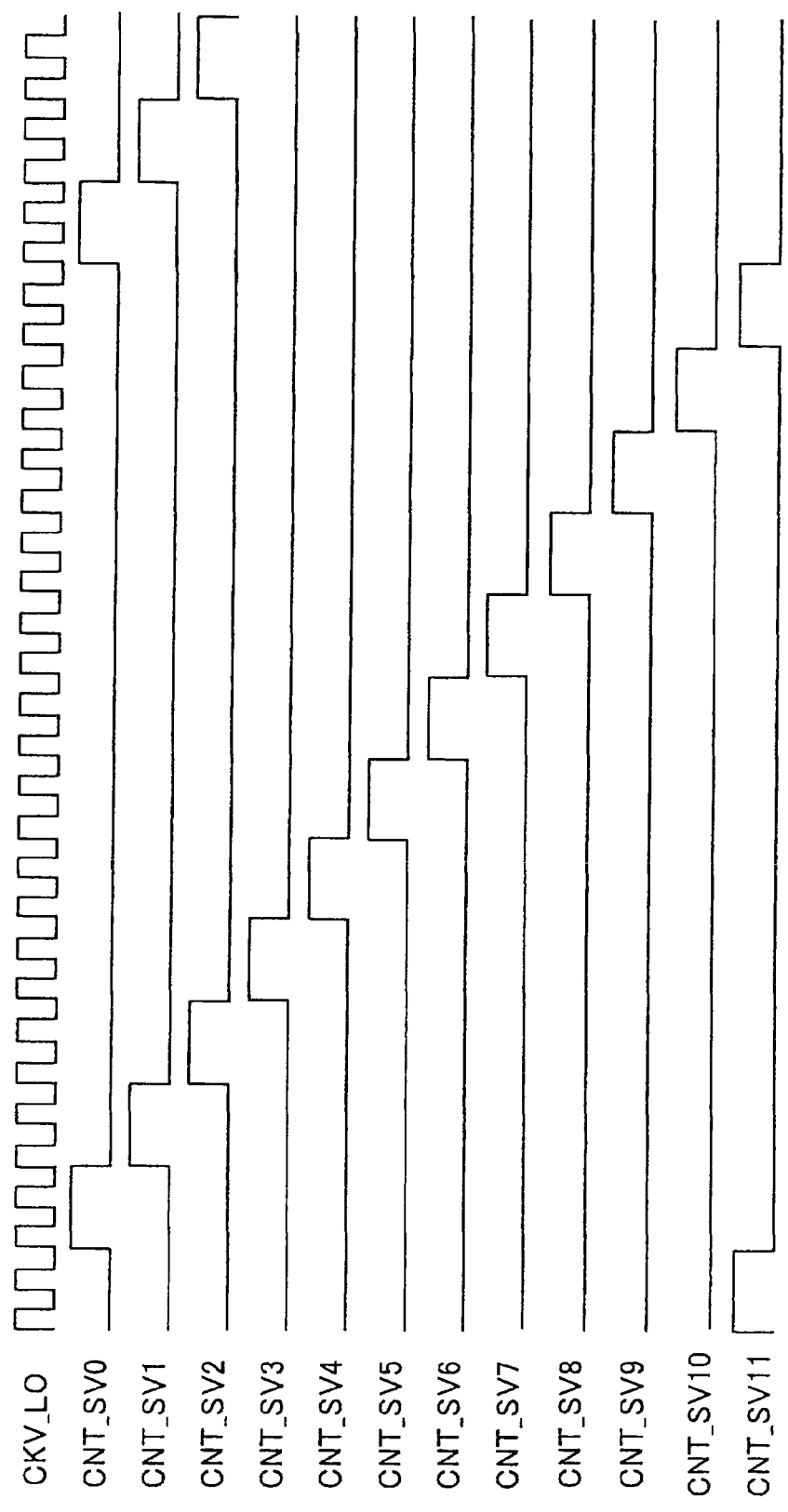
FIG. 12 A timing chart of signals that a digital control unit 604 in Embodiment 5 of the present invention generates.

The digital control unit 604 has a shift register using twelve registers, and is connected to the integrating switches 619 to 630. FIG. 12 is a timing chart of the control signals that the digital control unit 604 generates. The CKV_LO signal is input into the gate of the sampling switch 5. The CNT_SV0 to 11 signals are input into the gates of the integrating switches 619 to 630 respectively.

An operation of the sampling mixer 600 will be explained by using the in-phase sampling mixer portion 602. The in-phase sampling mixer portion 602 integrates the discrete signal by the history capacitor 6 and the rotation capacitors 607 to 618 over two periods of the CKV_LO signal, and thus acts as the first-stage FIR filter. At this time, a sampling rate is decimated to 1/2.

Then, the signals integrated in the rotation capacitors 607 to 618 are discharged to the buffer capacitor 15. At this time, when the number of the rotation capacitors that discharge the signal at a time to the buffer capacitor 15 is changed to four, three, and two, the decimation ratio of the second FIR filter can be changed to three stages, i.e., 1/4, 1/3, and 1/2.

When the signals are discharged at a time from four rotation capacitors to the buffer capacitor 15, the control signal SW_A, the control signal SW_B, and the control signal SW_D are high, and the control signal SW_C, the control signal SW_E, and the control signal SW_F are low. Thus, the gates of the discharging switches 631 to 634 connected to the rotation capacitors 607 to 610 are connected, and the signals are discharged to the buffer capacitor 15 by the CNT_SV4 signal. Similarly, the signals are discharged at a time from four rotation capacitors (the rotation capacitors 611 to 614, 615 to 618) out of the rotation capacitors 611 to 618 respectively. As a result, a sampling rate is decimated to 1/4.

When the signals are discharged at a time from three rotation capacitors to the buffer capacitor 15, the control signal SW_A, the control signal SW_C, and the control signal SW_E are high, and the control signal SW_B, the control signal SW_D, and the control signal SW_F are low. Thus, the gates of the discharging switches 631 to 633 connected to the rotation capacitors 607 to 609 are connected, and the signals are discharged to the buffer capacitor 15 by the CNT_SV3 signal. Similarly, the signals are discharged at a time from three rotation capacitors (the rotation capacitors 610 to 612, 613 to 615, 616 to 618) out of the rotation capacitors 610 to 618 respectively. As a result, a sampling rate is decimated to 1/3.

When the signals are discharged at a time from two rotation capacitors to the buffer capacitor 15, the control signal SW_D, and the control signal SW_F are high, and the control signal SW_A, the control signal SW_B, the control signal SW_C, and the control signal SW_E are low. Thus, the gates of the discharging switches 633, 634 connected to the rotation capacitors 609, 610 are connected, and the signals are discharged to the buffer capacitor 15 by the CNT_SV4 signal. Similarly, the signals are discharged at a time from two rotation capacitors (the rotation capacitors 607 to 608, 611 to 612, 613 to 614, 615 to 616, 617 to 618) out of the rotation capacitors 607, 608, 611 to 618 respectively. As a result, a sampling rate is decimated to 1/2.

With the above, the decimation ratio of the sampling mixer 600 can be changed to 1/8, 1/6, and 1/4 as a whole.

Now, the case where the sampling mixer 600 is applied to the digital terrestrial broadcasting (RF frequency=470 MHz to 770 MHz) will be explained by way of example hereunder. Suppose that SNR>70 dB is needed after the output signal of the sampling mixer 600 is AD-converted. In the example of this case, suppose that a ΔΣ type AD converter (ΔΣADC) not shown is connected to the later stage of the sampling mixer. As the common characteristic of the ΔΣADC, the FIR filter (1/2 decimation) that removes an aliasing noise at an SNR=70 dB after the AD conversion in the 40-times oversampling before the signal is input into the ΔΣADC is required. As a result, the decimation ratio of the sampling mixer 600 and the ΔΣADC can be switched to 1/16, 1/12, and 1/8. The switching condition is that a sampling rate at the input of the ΔΣADC is 40 MHz or more. Therefore, when the RF frequency is more than 470 MHz but below 482 MHz, the 1/8 decimation is executed and the sampling rate is 59 MHz to 61 MHz. When the RF frequency is more than 482 MHz but below 644 MHz, the 1/12 decimation is executed and the sampling rate is 41 MHz to 54 MHz. When the RF frequency is more than 644 MHz, the 1/16 decimation is executed and the sampling rate is 41 MHz to 48 MHz. That is, in case the sampling mixer 600 is applied to the RF frequency 470 MHz to 770 MHz, a maximum operating frequency of the ΔΣADC connected to the later stage of the sampling mixer 600 is 61 MHz. In contrast, when the decimation ratio of the sampling mixer is fixed to the lowest 1/8, a maximum operating frequency of the ΔΣADC is 96 MHz. As a result, because the decimation ratio can be changed, the operating frequency can be lowered by 36% in the example of this case. The application to the digital terrestrial broadcasting is explained at this time, but this sampling mixer may be applied to other wideband communication systems.

As described above, according to the sampling mixer of the present embodiment, the decimation ratio of the sampling rate can be switched by changing the number of the rotation capacitors that discharge the signal at a time to the buffer capacitor. As a result, in case the AD converter is connected to the later stage of the sampling mixer, an operating frequency of the AD converter can be lowered and a current consumption can be suppressed.

(Embodiment 6)

Figure 13:
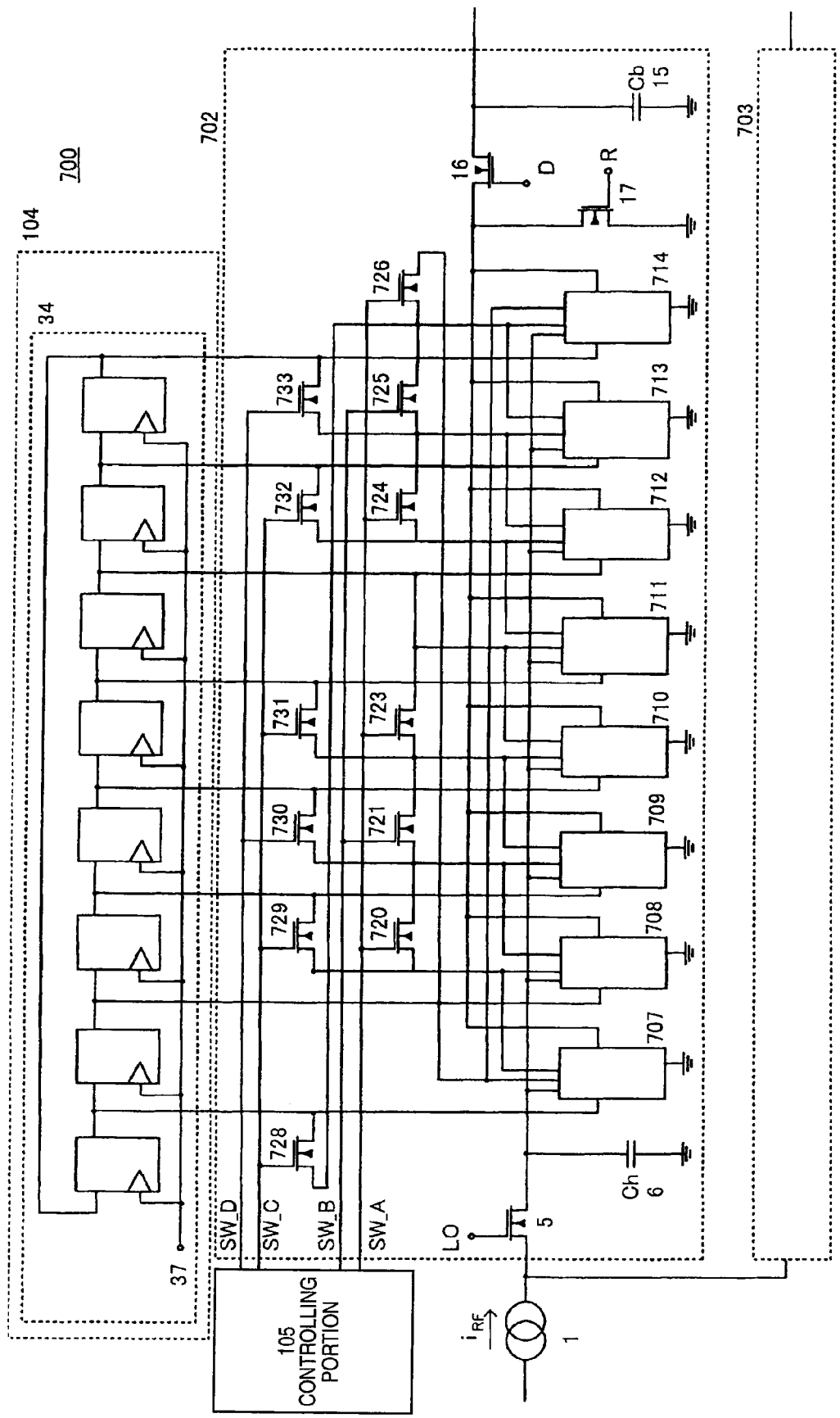
FIG. 13 A circuit diagram of a sampling mixer 700 in Embodiment 6 of the present invention.

FIG. 13 is a circuit diagram of a sampling mixer 700 in Embodiment 6 of the present invention. Only differences from Embodiment 1 will be explained hereunder. The present embodiment provides a sampling mixer in which an in-phase sampling mixer portion 702 and an opposite-phase sampling mixer portion 703 are provided instead of the in-phase sampling mixer portion 102 and the opposite-phase sampling mixer portion 103 in Embodiment 1.

In the present embodiment, in place of the rotation capacitors 7 to 14, the integrating switches 18 to 25, and the discharging switches 26 to 33 in the in-phase sampling mixer portion 102 in Embodiment 1, rotation capacitor portions 707 to 714 are provided to the in-phase sampling mixer portion 702. Also, the in-phase sampling mixer portion 702 has rotation capacitor switching switches 720 to 726, and discharge signal switches 729 to 733. The opposite-phase sampling mixer portion 703 has the same configuration as the in-phase sampling mixer portion 702. The signals being input into the gates of the sampling switches have a phase difference of 180 degree, and the sampling timing is shifted in phase by 180 degree.

Figure 14:
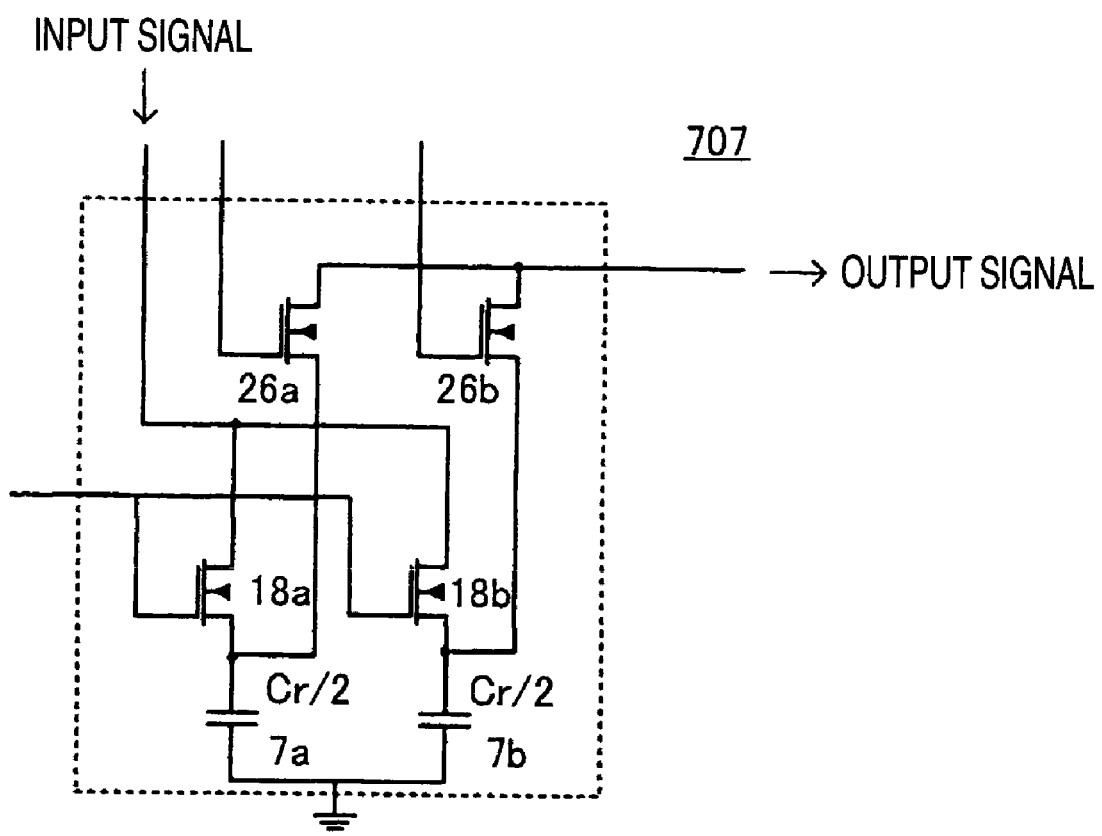
FIG. 14 A circuit diagram of a rotation capacitor portion 707 in Embodiment 6 of the present invention.

FIG. 14 is a circuit diagram of the rotation capacitor portion 707. The rotation capacitor portion 707 has rotation capacitors 7a, 7b, integrating switches 18a, 18b, and discharging switches 26a, 26b. Respective capacitances of the rotation capacitors 7a, 7b are a half of the rotation capacitor 7 (see FIG. 1). The same control signal is input into the gates of the integrating switches 18a, 18b, and the rotation capacitors 7a, 7b integrates the signal simultaneously. The signal integrated by the rotation capacitor 7a is discharged by the control signal being input into the gate of the discharging switch 26a. Also, the signal integrated by the rotation capacitor 7b is discharged by the control signal being input into the gate of the discharging switch 26b. That is, the rotation capacitors 7a, 7b can integrate the signal simultaneously, and discharge the signal at a different timing. Otherwise, the rotation capacitors 7a, 7b can also discharge the signal simultaneously when the same control signal is input into the gates of the discharging switches 26a, 26b. The rotation capacitor portions 708 to 714 have the similar configuration to the rotation capacitor portion 707.

In FIG. 13, the rotation capacitor portion 707 is connected to the rotation capacitor portion 708 and the rotation capacitor portion 714. The rotation capacitor portions 708 to 714 are connected similarly. The rotation capacitor switching switch 720 is connected between the rotation capacitor portion 708 and the rotation capacitor portion 709. Similarly, the rotation capacitor switching switches 721 to 726 are connected between the rotation capacitor portions 709 to 714 respectively. A discharge signal switch 728 is connected between the rotation capacitor portion 714 and the digital control unit 104. Similarly, the discharge signal switches 729 to 733 are connected between the rotation capacitor portions 708 to 710, 712, 713 respectively.

The gates of the rotation capacitor switching switches 720, 723, 724, 726 are connected to the control signal SW_A of the controlling portion 105. The gates of the rotation capacitor switching switches 721, 725 are connected to the control signal SW_B of the controlling portion 105. The gates of the discharge signal switches 728, 729, 731, 732 are connected to the control signal SW_C of the controlling portion 105. The gates of the discharge signal switches 730, 733 are connected to the control signal SW_D of the controlling portion 105.

An operation of the second-stage FIR filter will be explained hereunder. The second-stage FIR filter is constructed by discharging the signals integrated in the rotation capacitor portions 707 to 714 to the buffer capacitor 15. At this time, when the number of the rotation capacitor portions that discharge the signal at a time to the buffer capacitor 15 is switched, the decimation ratio of the second-stage FIR filter is switched in three stages, i.e., 1/4, 1/2, 1.

When the decimation ratio is 1/4, the control signal SW_A and the control signal SW_B are high, and the control signal SW_C and the control signal SW_D are low. At this time, one rotation capacitor in the rotation capacitor portion 707, all rotation capacitors in the rotation capacitor portions 708 to 710, and one rotation capacitor in the rotation capacitor portion 711 discharge the signals at a time to the buffer capacitor 15 by the CNT_SV5 signal of the digital control unit 104. Similarly, one rotation capacitor in the rotation capacitor portion 711, all rotation capacitors in the rotation capacitor portions 712 to 714, and one rotation capacitor in the rotation capacitor portion 707 discharge the signals at a time to the buffer capacitor 15 by the CNT_SV1 signal of the digital control unit 104. The number of the rotation capacitor portions connected simultaneously to the buffer capacitor 15 is five, but a timing is given by the CNT_SV1 signal and the CNT_SV5 signal every four periods of the CKV_LO signal. Therefore, a decimation ratio is given as 1/4.

When the decimation ratio is 1/2, the control signal SW_A and the control signal SW_D are high, and the control signal SW_B and the control signal SW_C are low. At this time, one rotation capacitor in the rotation capacitor portion 707, two rotation capacitors in the rotation capacitor portion 708, and one rotation capacitor in the rotation capacitor portion 709 discharge the signals at a time to the buffer capacitor 15 by the CNT_SV3 signal. Based on the similar operation, the signals are discharged by the CNT_SV5, 7, 1 signals respectively. The number of the rotation capacitor portions connected simultaneously to the buffer capacitor 15 is three, but a timing is given by the CNT_SV1, 3, 5, 7 signals every two periods of the CKV_LO signal. Therefore, a decimation ratio is given as 1/2.

When the decimation ratio is 1, the control signal SW_C and the control signal SW_D are high, and the control signal SW_A and the control signal SW_B are low. At this time, one rotation capacitor in the rotation capacitor portion 707 and one rotation capacitor in the rotation capacitor portion 708 discharge the signals at a time to the buffer capacitor 15 by the CNT_SV2 signal. Based on the similar operation, the signals are discharged by the CNT_SV3, 4, 5, 6, 7, 0, 1 signals respectively. The number of the rotation capacitor portions connected simultaneously to the buffer capacitor 15 is two, but a timing is given by the CNT_SV0 to 7 signals every one period of the CKV_LO signal. Therefore, a decimation ratio is given as 1.

Figure 15:
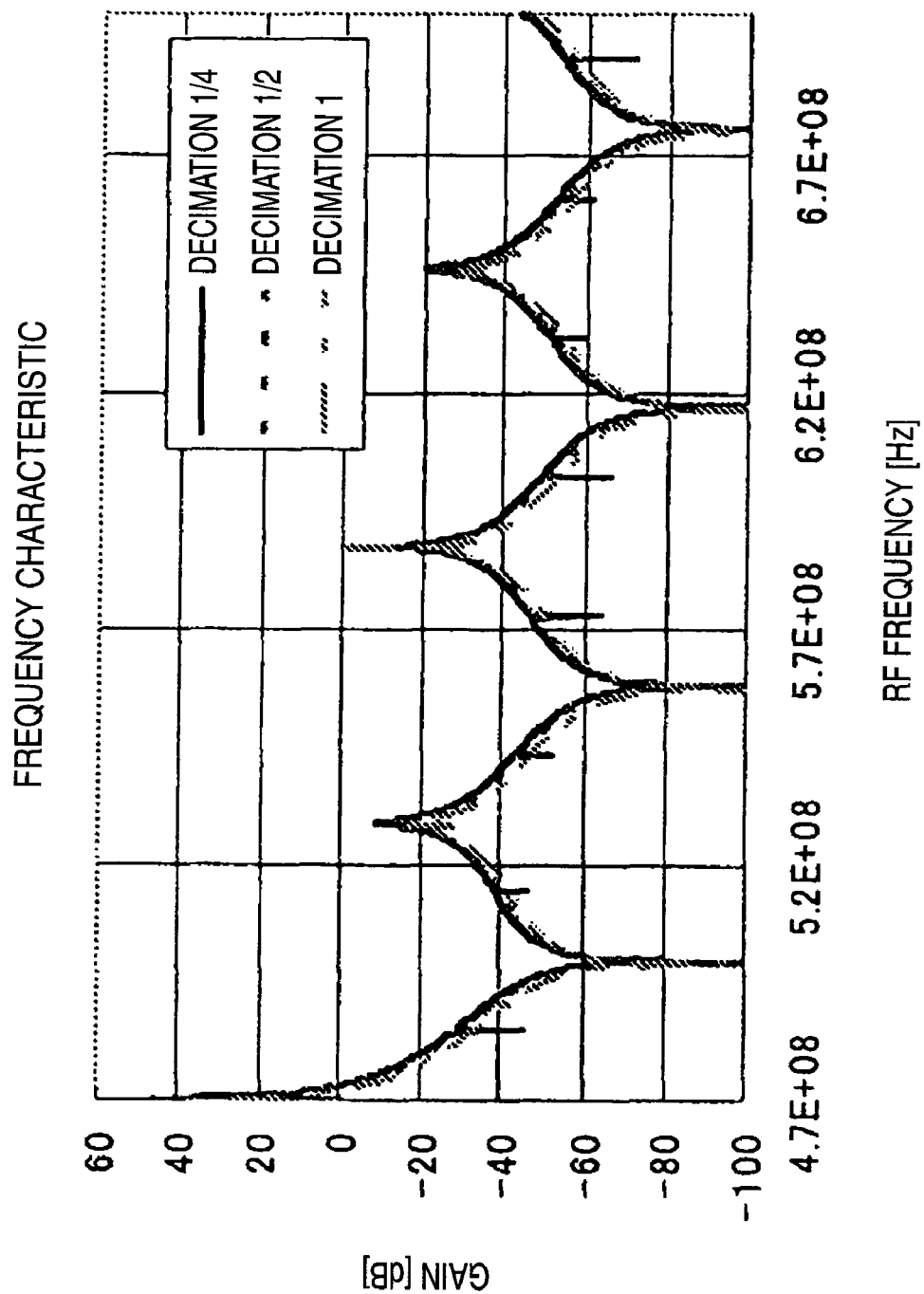
FIG. 15 Views showing frequency characteristics of the sampling mixer 700 in Embodiment 6 of the present invention.

FIG. 15 shows the frequency characteristics of the sampling mixer 700. At this time, the frequency of the LO signal is 470 MHz. As shown in FIG. 15, a notch becomes deeper than that in the case of the sampling mixer 100 in Embodiment 1 (FIG. 3(a)). This is because the signals that are integrated at different timings such that an amount of attenuation can be set large by deepening the notch are weighted by the rotation capacitance and then connected to the buffer capacitor 15. In the present embodiment, the rotation capacitances of the rotation capacitors are set to a half of those of the original rotation capacitors respectively, but other capacitances may be employed. According to the sampling mixer 700 of the present embodiment, the notch deeper than that in the frequency characteristics of the sampling mixer 100 in Embodiment 1 is formed and an amount of attenuation can be set large, and thus an aliasing component can be removed.

From the above, according to the sampling mixer of the present embodiment, the number of the rotation capacitor portions that discharge the signals at a time to the buffer capacitor is changed, and thus the decimation ratio of the sampling rate can be switched. Also, a depth of the notch can be increased by weighting the rotation capacitance, and thus an aliasing component can be removed further.

Also, in the present embodiment, the number of the rotation capacitor portions that are connected to the buffer capacitor at a time is set to five, three, and two, but the number in excess of the above may be employed.

(Embodiment 7)

Figure 16:
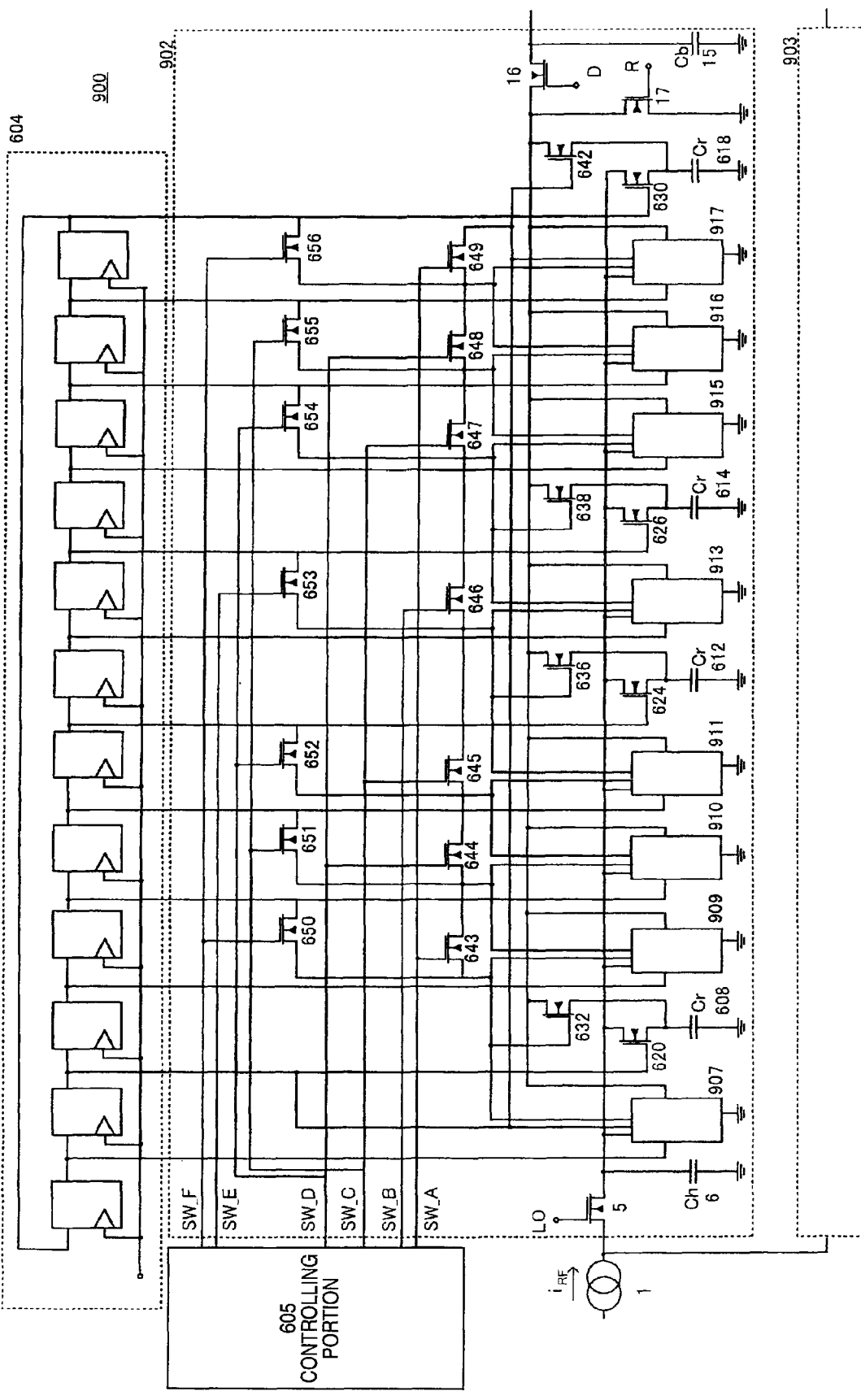
FIG. 16 A circuit diagram of a sampling mixer 900 in Embodiment 7 of the present invention.

FIG. 16 is a circuit diagram of a sampling mixer 900 in Embodiment 7 of the present invention. Only differences from Embodiment 5 will be explained hereunder. The present embodiment provides the sampling mixer in which an in-phase sampling mixer portion 902 and an opposite-phase sampling mixer portion 903 are provided, instead of the in-phase sampling mixer portion 602 and the opposite-phase sampling mixer portion 603 in Embodiment 5.

In the present embodiment, rotation capacitor portions 907, 909 to 911, 913, 915 to 917 are provided to the in-phase sampling mixer portion 902, in place of the rotation capacitors 607, 609 to 611, 613, 615 to 617, the integrating switches 619, 621 to 623, 625, 627 to 629, and the discharging switches 631, 633 to 635, 637, 639 to 641 in the in-phase sampling mixer portion 602 in Embodiment 5. The rotation capacitor portions 907, 909 to 911, 913, 915 to 917 have the same configuration as the rotation capacitor portion 707 shown in FIG. 14. The opposite-phase sampling mixer portion 903 has the same configuration as the opposite-phase sampling mixer portion 903. The signals being input into the gates of the sampling switches have a phase difference of 180 degree, and the sampling timing is shifted in phase by 180 degree.

In FIG. 16, the rotation capacitor portion 907 is connected to the rotation capacitor portion 909 and the rotation capacitor portion 917. Also, the rotation capacitor portions 909 to 911, 913, 915 to 917 are connected similarly.

An operation of the second-stage FIR filter will be explained hereunder. When the decimation ratio is 1/4, the rotation capacitor 608, one rotation capacitor in the rotation capacitor portion 907, the rotation capacitor 608 and all rotation capacitors in the rotation capacitor portions 909, 910, and one rotation capacitor in the rotation capacitor portion 911 (i.e., five rotation capacitors (portions)) discharge the signals at a time to the buffer capacitor 15. Also, remaining rotation capacitor portions and rotation capacitors are explained similarly.

When the decimation ratio is 1/3, one rotation capacitor in the rotation capacitor portion 907, the rotation capacitor 608 and all rotation capacitors in the rotation capacitor portion 909, and one rotation capacitor in the rotation capacitor portion 910 (i.e., four rotation capacitors (portions)) discharge the signals at a time to the buffer capacitor 15. Also, remaining rotation capacitor portions and rotation capacitors are explained similarly.

When the decimation ratio is 1/2, one rotation capacitor in the rotation capacitor portion 907, and the rotation capacitor 608 and one rotation capacitor in the rotation capacitor portion 909 (i.e., three rotation capacitors (portions)) discharge the signals at a time to the buffer capacitor 15. Also, remaining rotation capacitor portions and rotation capacitors are explained similarly.

According to the sampling mixer 900 of the present embodiment, the signals integrated at different timings are weighted such that the notch is deepened and an amount of attenuation is increased, and then connected to the buffer capacitor 15. Therefore, the notch can be made deeper and an amount of attenuation can be set larger, in contrast to those of the frequency characteristics of the sampling mixer 600 in Embodiment 5.

With the above, according to the sampling mixer of the present embodiment, when the number of the rotation capacitor portions that discharge the signals at a time to the buffer capacitor is changed, the decimation ratio of the sampling rate can be switched. Also, a depth of the notch can be increased by weighting the rotation capacitance, and thus an aliasing component can be removed further more.

(Embodiment 8)

In the present embodiment, a radio equipment using the sampling mixer explained in Embodiments 1 to 7 will be explained hereunder.

Figure 7:
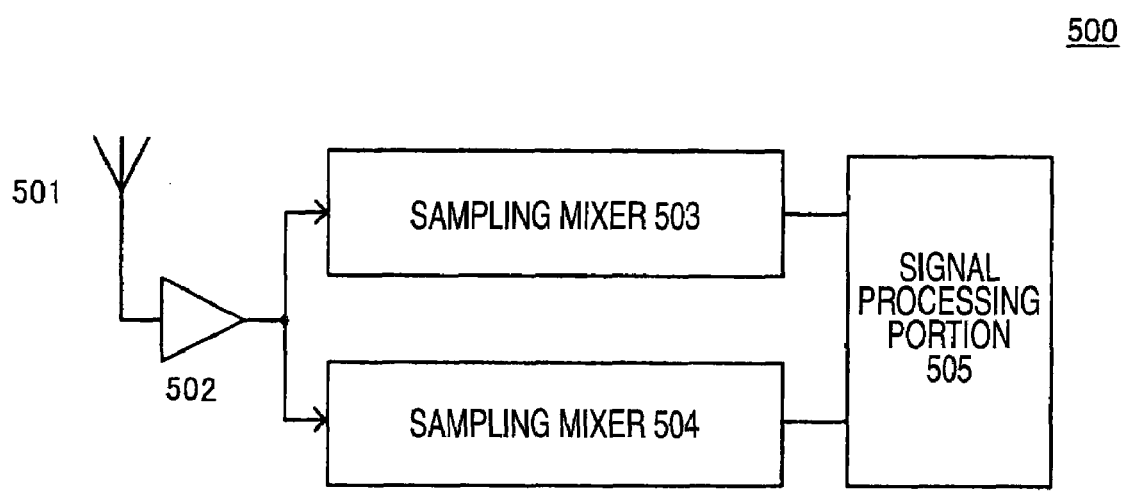
FIG. 7 A block diagram of a radio equipment 500 in Embodiment 8 of the present invention.
Figure 8:
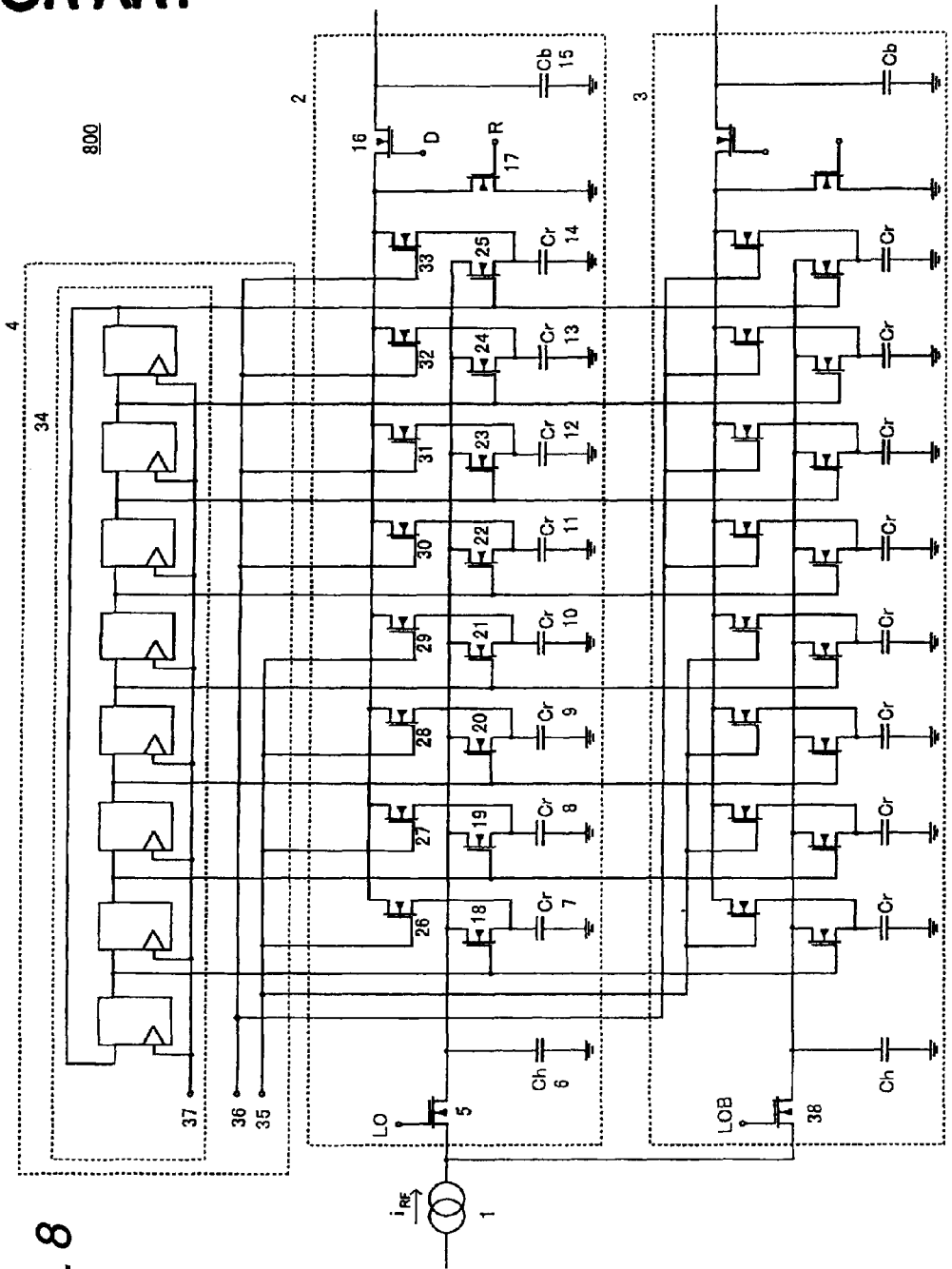
FIG. 8 A circuit diagram of a sampling mixer in the prior art.
Figure 9:
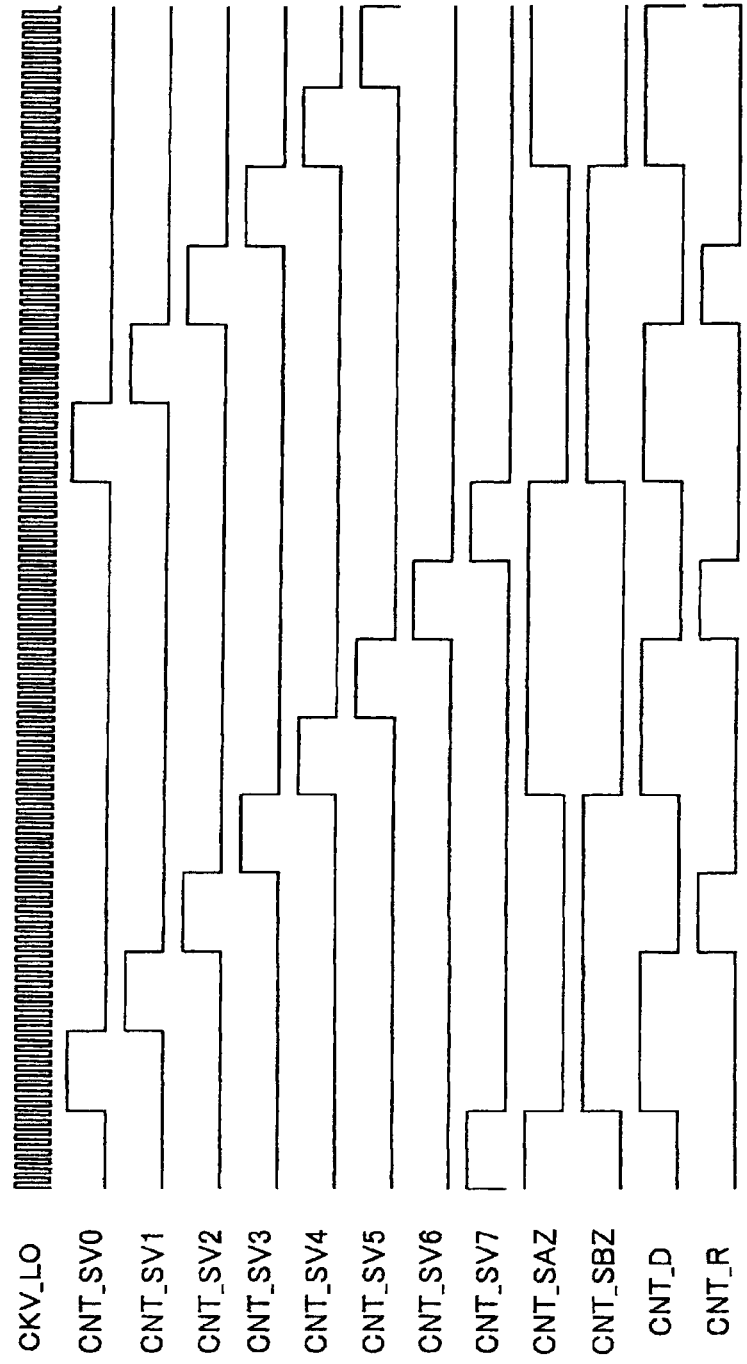
FIG. 9 A timing chart of signals that a digital control unit in the sampling mixer in the prior art generates.
Figure 10:
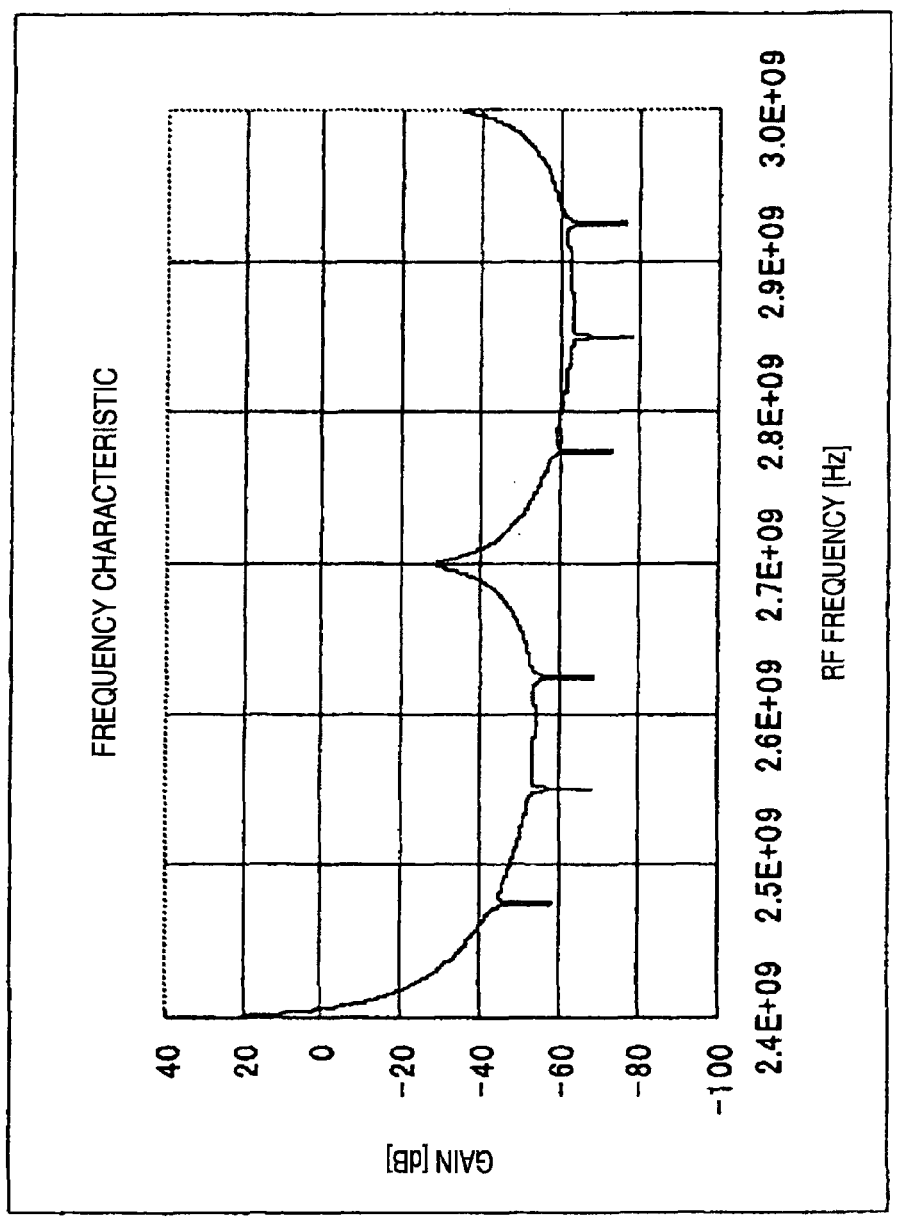
FIG. 10 Views showing frequency characteristics of the sampling mixer in the prior art.

FIG. 7 is a block diagram of a radio equipment 500 in Embodiment 8 of the present invention. In FIG. 7, an antenna 501 is connected to a low-noise amplifier 502, then the low-noise amplifier 502 is connected to a sampling mixer 503 and a sampling mixer 504, which are either of the sampling mixers explained in Embodiments 1 to 7, and then the sampling mixer 503 and the sampling mixer 504 are connected to a signal processing portion 505. A transmitter portion is not illustrated herein.

A receiving operation of the radio equipment 500 constructed in this manner will be explained hereunder. In the radio equipment 500 of the present embodiment, the received signal received by the antenna 501 is amplified by the low-noise amplifier 502 and is output to the sampling mixers 503, 504. The sampling mixers 503, 504 output a baseband signal, which is obtained by applying a frequency conversion and a discretization in time to the received signal, to the signal processing portion 505 respectively.

A difference between the sampling mixer 503 and the sampling mixer 504 resides in that the sampling timing in the sampling switch is shifted in phase by 180 degree. Accordingly, the received signal is subjected to the orthogonal modulation. The signal processing portion 505 processes the input baseband signal and outputs sound, data, and the like to the user.

The controlling portions of the sampling mixers 503, 504 control the number of the rotation capacitors that discharge the signals at a time to the buffer capacitor, in answer to the information such as the frequency of the received signal, the radio system that is holding the communication, and the like.

As explained above, according to the radio equipment of the present embodiment, when the number of the rotation capacitor portions that discharge the signals at a time to the buffer capacitor is changed, the decimation ratio of the sampling rate can be switched.

As a result, the quantization noise generated in the AD conversion can be reduced in the received signal whose modulation band is wide in contrast to the RF frequency. Also, since the decimation ratio is changed in response to the fractional band of the modulation band with respect to the RF frequency, the AD converter that operates at a high speed is not needed and a current consumption can be suppressed.

Also, in the present embodiment, the number of the rotation capacitors that discharge the signals at a time to the buffer capacitor is switched by the control signal from the controlling portion in the sampling mixer. But such number of the rotation capacitors may be switched by the control signal from the signal processing portion.

The present invention is explained in detail with reference to the particular embodiments. But it is apparent for those skilled in the art that various variations and modifications can be applied without departing from a spirit and a scope of the present invention.

This application is based upon Japanese Patent Application (Patent Application No. 2005-337345) filed on Nov. 22, 2005 and Japanese Patent Application (Patent Application No. 2006-302798) filed on Nov. 8, 2006; the contents of which are incorporated herein by reference.

Industrial Applicability

The sampling mixer according to the present invention is serviceable for the radio circuit of the radio communication equipment, and is useful in converting a frequency of the signal.

The invention claimed is:

1. A sampling mixer comprising:
a history capacitor which integrates a received signal that is converted into current in a continuous time;
a plurality of rotation capacitors which are connected to the history capacitor for a predetermined time, and integrates the received signal; and
a buffer capacitor which integrates signals discharged from the plurality of rotation capacitors,
wherein, when signals that are integrated by the plurality of rotation capacitors are discharged to the buffer capacitor, a quantity of the plurality of rotation capacitors that are connected at a time to the buffer capacitor is changed;
wherein the plurality of rotation capacitors are eight rotation capacitors;
wherein the rotation capacitors are connected at a time to the buffer capacitor every four capacitors, two capacitors, or one capacitor;
wherein, when the rotation capacitors are connected at a time to the buffer capacitor every two capacitors, four groups in which the rotation capacitors are combined every two capacitors integrate the received signal sequentially; and
wherein, when the rotation capacitors are connected to the buffer capacitor every capacitor, each of the rotation capacitors integrates the received signal sequentially.

2. A sampling mixer comprising:
a history capacitor which integrates a received signal that is converted into current in a continuous time;
a plurality of rotation capacitors which are connected to the history capacitor for a predetermined time, and integrates the received signal; and
a buffer capacitor which integrates signals discharged from the plurality of rotation capacitors,
wherein, when signals that are integrated by the plurality of rotation capacitors are discharged to the buffer capacitor, a quantity of the plurality of rotation capacitors that are connected at a time to the buffer capacitor is changed;
wherein the plurality of rotation capacitors are eight rotation capacitors;
wherein the rotation capacitors are connected at a time to the buffer capacitor every four capacitors, two capacitors, or one capacitor;
wherein, when the rotation capacitors are connected at a time to the buffer capacitor every two capacitors, two groups in which the rotation capacitors are combined every two capacitors integrate the received signal sequentially; and
wherein, when the rotation capacitors are connected to the buffer capacitor every capacitor, two rotation capacitors integrates the received signal sequentially.

3. A sampling mixer comprising:
a history capacitor which integrates a received signal that is converted into current in a continuous time;

a plurality of rotation capacitors which are connected to the history capacitor for a predetermined time, and integrates the received signal; and a buffer capacitor which integrates signals discharged from the plurality of rotation capacitors, wherein, when signals that are integrated by the plurality of rotation capacitors are discharged to the buffer capacitor, a quantity of the plurality of rotation capacitors that are connected at a time to the buffer capacitor is changed;

wherein the plurality of rotation capacitors are twelve rotation capacitors; and wherein the rotation capacitors are connected at a time to the buffer capacitor every four capacitors, three capacitors, or two capacitors.

4. A sampling mixer comprising:

a history capacitor which integrates a received signal that is converted into current in a continuous time;

a plurality of rotation capacitors which are connected to the history capacitor for a predetermined time, and integrates the received signal; and a buffer capacitor which integrates signals discharged from the plurality of rotation capacitors, wherein, when signals that are integrated by the plurality of rotation capacitors are discharged to the buffer capacitor, a quantity of the plurality of rotation capacitors that are connected at a time to the buffer capacitor is changed;

wherein at least one of the plurality of rotation capacitors that are connected at a time to the buffer capacitor has a capacitance that is different from capacitances of remaining rotation capacitors;

wherein the plurality of rotation capacitors are eight rotation capacitors; and wherein the rotation capacitors are connected at a time to the buffer capacitor every five capacitors, three capacitors, or two capacitors.

5. A sampling mixer comprising:

a history capacitor which integrates a received signal that is converted into current in a continuous time;

a plurality of rotation capacitors which are connected to the history capacitor for a predetermined time, and integrates the received signal; and a buffer capacitor which integrates signals discharged from the plurality of rotation capacitors, wherein, when signals that are integrated by the plurality of rotation capacitors are discharged to the buffer capacitor, a quantity of the plurality of rotation capacitors that are connected at a time to the buffer capacitor is changed;

wherein at least one of the plurality of rotation capacitors that are connected at a time to the buffer capacitor has a capacitance that is different from capacitances of remaining rotation capacitors;

wherein the rotation capacitors are twelve rotation capacitors; and wherein the rotation capacitors are connected at a time to the buffer capacitor every five capacitors, four capacitors, or three capacitors.

* * * * *